(12) United States Patent
Kim et al.

(10) Patent No.: US 12,520,630 B2
(45) Date of Patent: Jan. 6, 2026

(54) DISPLAY DEVICE AND METHOD OF MANUFACTURING THE SAME

(71) Applicant: Samsung Display Co., LTD., Yongin-si (KR)

(72) Inventors: Jee Hoon Kim, Yongin-si (KR); Shin Hyuk Yang, Yongin-si (KR); Jae Seol Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 663 days.

(21) Appl. No.: 17/739,600

(22) Filed: May 9, 2022

(65) Prior Publication Data

US 2022/0359791 A1  Nov. 10, 2022

(30) Foreign Application Priority Data

May 10, 2021  (KR) .................. 10-2021-0060150

(51) Int. Cl.
*H01L 25/075* (2006.01)
*H10H 20/01* (2025.01)
(Continued)

(52) U.S. Cl.
CPC ..... *H10H 20/8312* (2025.01); *H01L 25/0753* (2013.01); *H10H 20/01* (2025.01);
(Continued)

(58) Field of Classification Search
CPC ... H01L 25/167; H10H 29/142; H10D 86/441
See application file for complete search history.

(56) References Cited

U.S. PATENT DOCUMENTS 9,570,425 B2  2/2017  Do
11,171,125 B2  11/2021  Heo et al.
(Continued)

FOREIGN PATENT DOCUMENTS

CN  109873025  6/2019
KR  10-0826421  4/2008
(Continued)

OTHER PUBLICATIONS

US 10,930,830 B2, 02/2021, Do et al. (withdrawn)

*Primary Examiner* — William B Partridge
*Assistant Examiner* — Felix B Andrews
(74) *Attorney, Agent, or Firm* — Womble Bond Dickinson (US) LLP

(57) ABSTRACT

A display device includes a substrate, a first and second bank patterns disposed on a substrate, a gate insulating layer overlapping the first bank pattern, a first transistor including a first and second electrodes disposed on the substrate with the first bank pattern interposed therebetween in a thickness direction, a first semiconductor pattern connected to the first electrode and the second electrode and disposed on a side surface of the first bank pattern, and a first gate electrode disposed to correspond to the first semiconductor pattern with the first semiconductor pattern and the gate insulating layer interposed therebetween, a light emitting element connected to the first transistor and having a first end part and a second end part, a first pixel electrode that contacts the first end part of the light emitting element, and a second pixel electrode that contacts the second end part of the light emitting element.

14 Claims, 19 Drawing Sheets

(51) Int. Cl.
   *H10H 20/831*    (2025.01)
   *H10H 20/857*    (2025.01)
(52) U.S. Cl.
   CPC ......... *H10H 20/857* (2025.01); *H10H 20/032*
       (2025.01); *H10H 20/0364* (2025.01)

(56) References Cited

U.S. PATENT DOCUMENTS

| | | | |
|---|---|---|---|
| 11,257,887 B2 | 2/2022 | Nguyen et al. | |
| 2005/0030268 A1* | 2/2005 | Zhang | G09G 3/3208 345/83 |
| 2008/0265293 A1* | 10/2008 | Lee | H10D 62/121 257/E27.113 |
| 2011/0284846 A1* | 11/2011 | Endo | H10D 99/00 438/151 |
| 2013/0257437 A1* | 10/2013 | Jin | G01R 31/2635 257/40 |
| 2014/0071368 A1* | 3/2014 | Kim | H10H 20/855 438/30 |
| 2015/0084054 A1* | 3/2015 | Fan | H01L 25/0753 257/72 |
| 2015/0372063 A1* | 12/2015 | Lee | H10K 59/122 257/40 |
| 2017/0263184 A1* | 9/2017 | Chen | G09G 3/3291 |
| 2018/0102383 A1* | 4/2018 | Kim | H10D 86/021 |
| 2018/0175104 A1* | 6/2018 | Kang | H10H 29/10 |
| 2018/0342691 A1* | 11/2018 | Lu | H01L 25/167 |
| 2019/0326348 A1* | 10/2019 | Im | G09G 3/32 |
| 2020/0005703 A1 | 1/2020 | Kim et al. | |
| 2021/0005596 A1 | 1/2021 | Do et al. | |
| 2021/0265439 A1 | 8/2021 | Peng et al. | |
| 2022/0052032 A1 | 2/2022 | Li et al. | |

FOREIGN PATENT DOCUMENTS

| | | |
|---|---|---|
| KR | 10-1436123 | 11/2014 |
| KR | 10-1711187 | 3/2017 |
| KR | 10-1730977 | 4/2017 |
| KR | 10-1789123 | 10/2017 |
| KR | 10-1814104 | 1/2018 |
| KR | 10-2020-0001657 | 1/2020 |
| KR | 10-2020-0057150 | 5/2020 |
| KR | 10-2020-0070493 | 6/2020 |
| KR | 10-2020-0079379 | 7/2020 |
| KR | 10-2020-0115753 | 10/2020 |

* cited by examiner

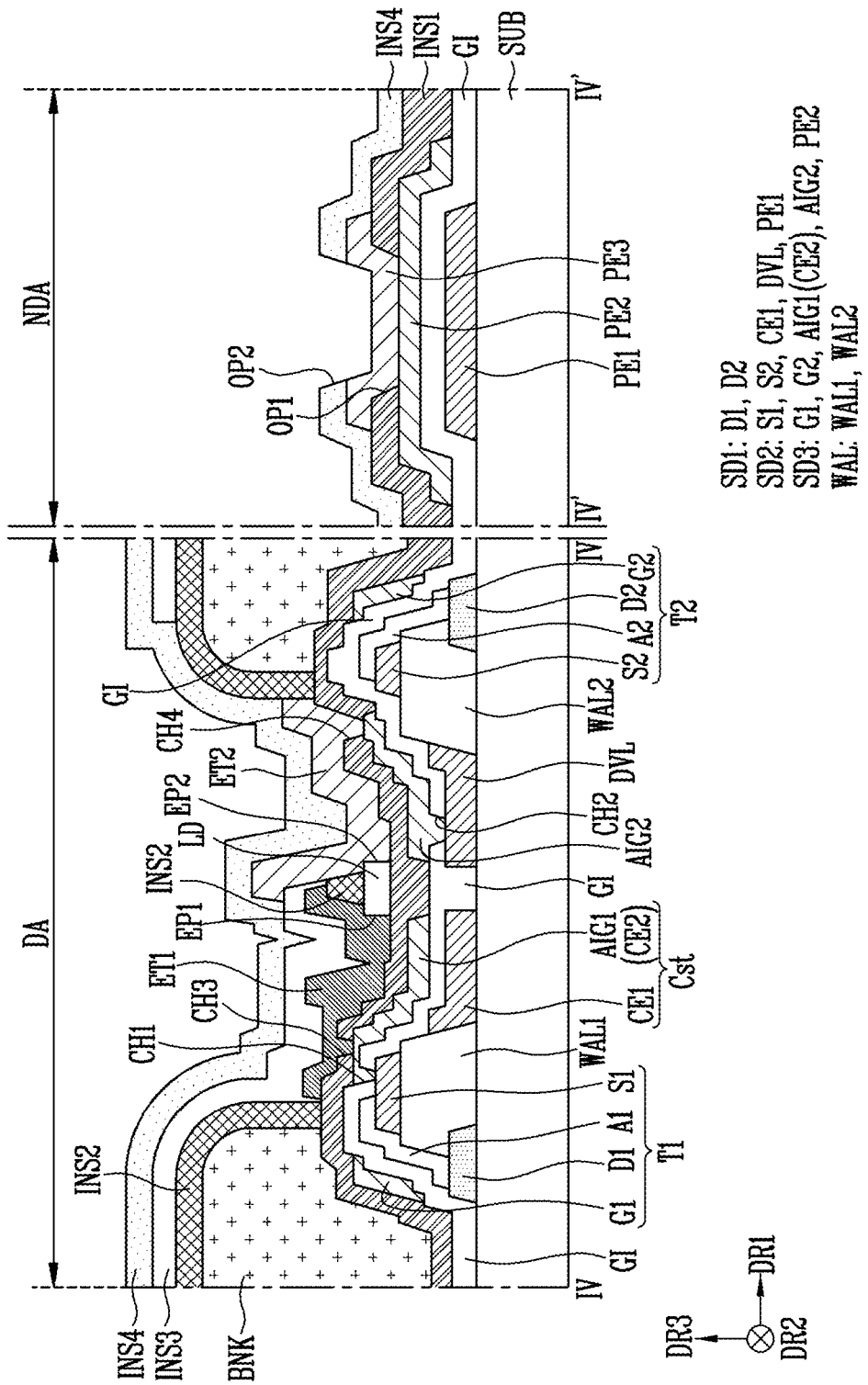

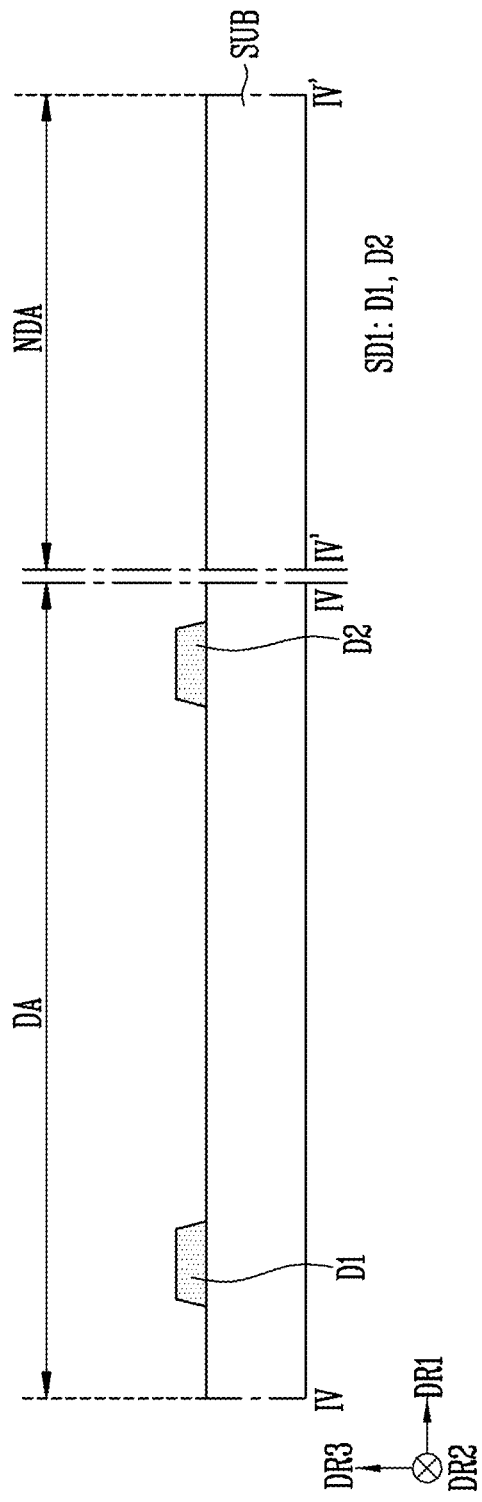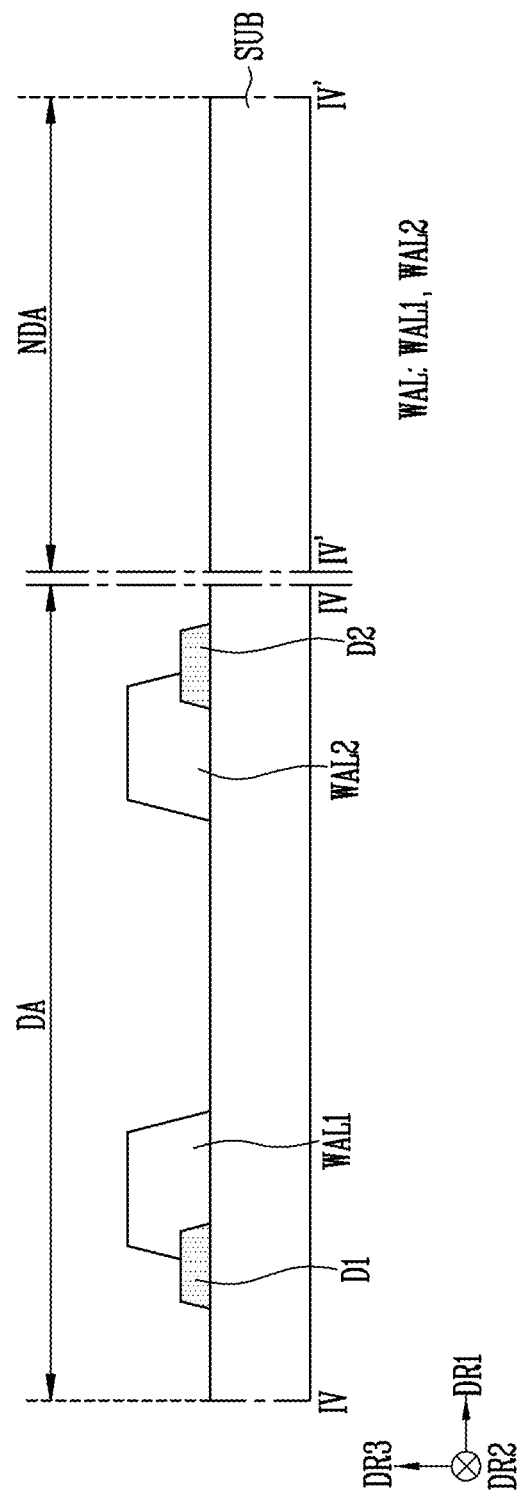

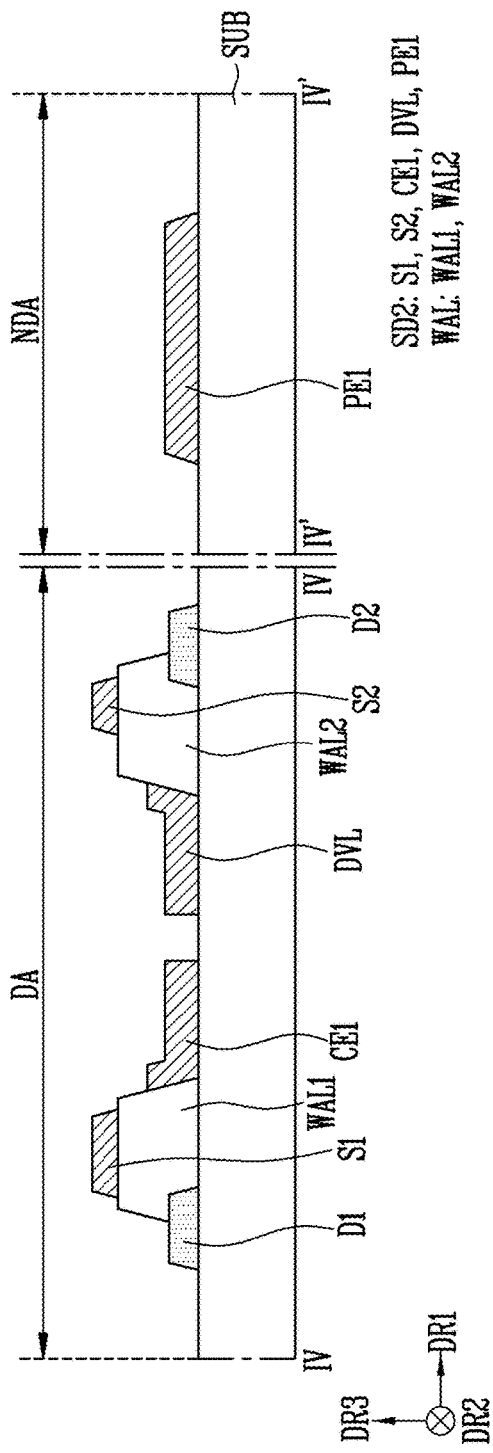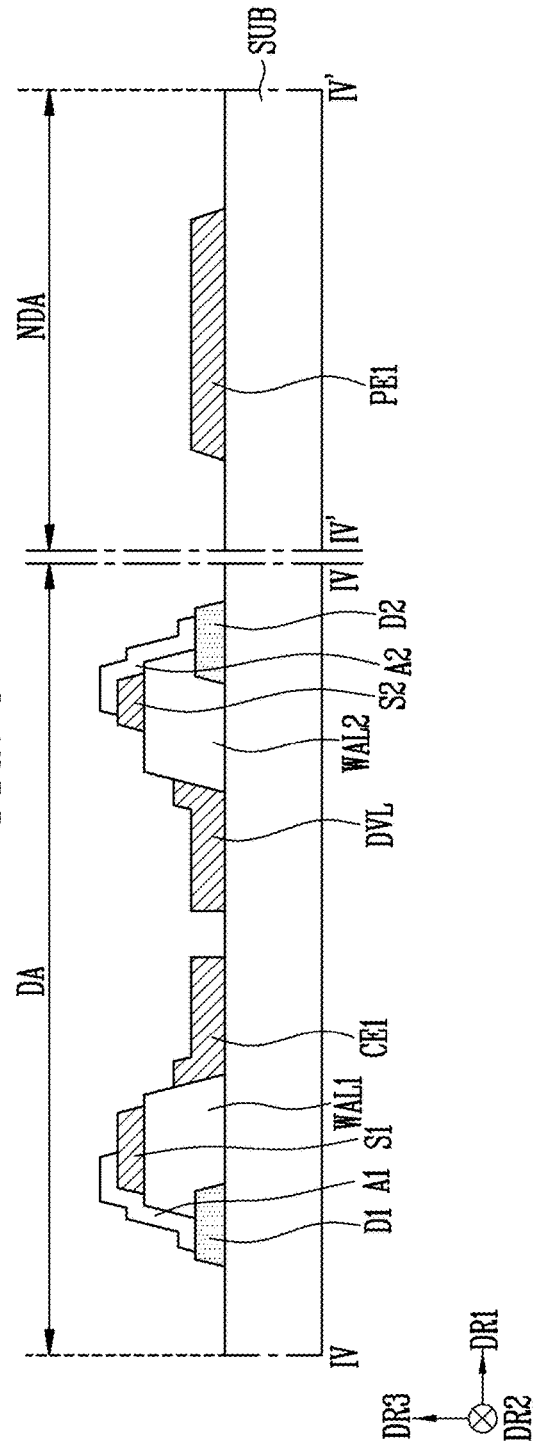

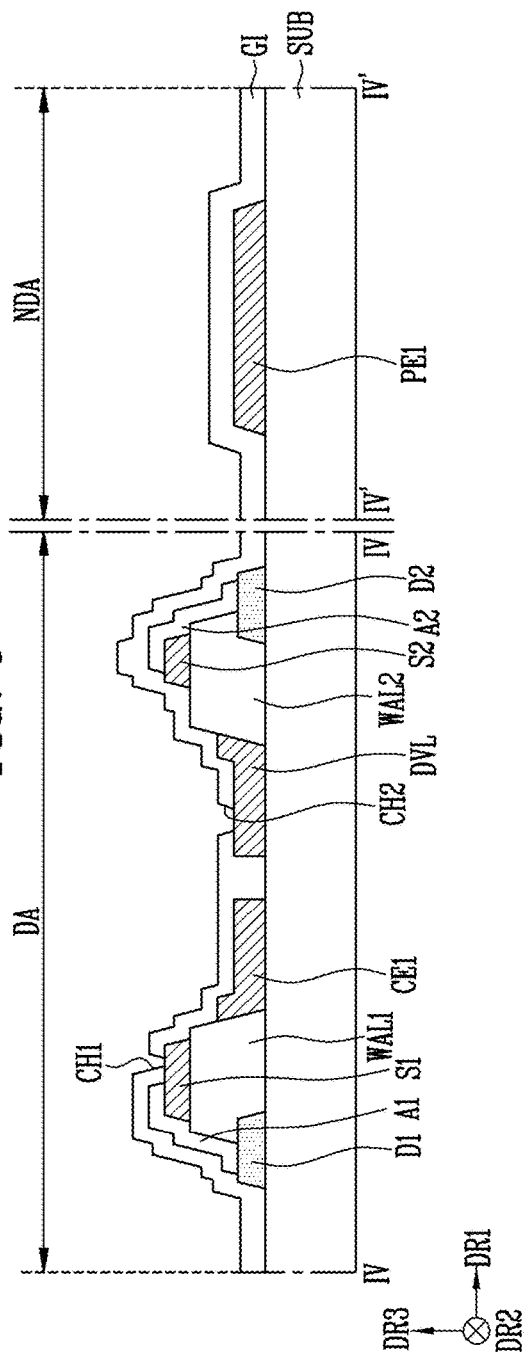
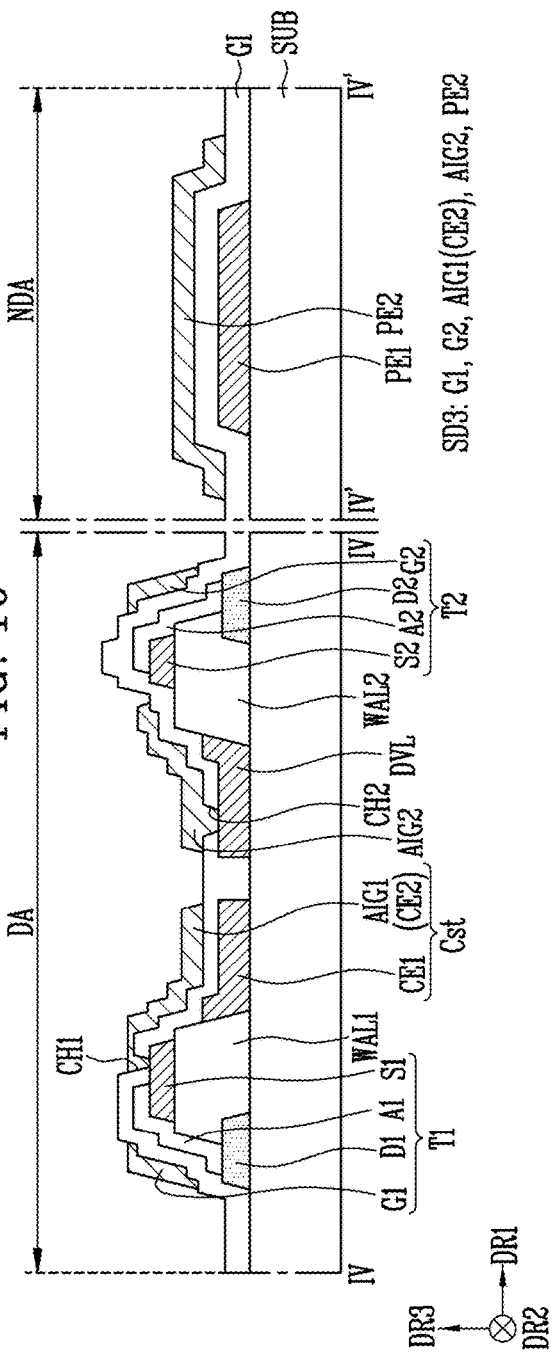

DISPLAY DEVICE AND METHOD OF MANUFACTURING THE SAME

CROSS-REFERENCE TO RELATED APPLICATION(S)

This application claims priority to and the benefit of Korean Patent Application No. 10-2021-0060150 under 35 U.S.C. § 119, filed in the Korean Intellectual Property Office (KIPO) on May 10, 2021, the entire contents of which are incorporated herein by reference.

BACKGROUND

1. Technical Field

The disclosure relates to a display device and a method of manufacturing the same.

2. Description of the Related Art

As interest in an information display is increasing and a demand for using a portable information media is increasing, a demand and commercialization for a display device are being focused.

SUMMARY

An object of the disclosure is to provide a display device having a simplified structure and manufacturing method, and a method of manufacturing the same.

A display device according to an embodiment of the disclosure may include a substrate, a first bank pattern and a second bank pattern disposed on a substrate and disposed to be spaced apart from each other, a gate insulating layer overlapping the first bank pattern, a first transistor including a first electrode and a second electrode disposed on the substrate with the first bank pattern interposed therebetween in a thickness direction of the substrate, a first semiconductor pattern electrically connected to the first electrode and the second electrode and disposed on a side surface of the first bank pattern, and a first gate electrode disposed to correspond to the first semiconductor pattern with the first semiconductor pattern and the gate insulating layer interposed therebetween, a light emitting element electrically connected to the first transistor and having a first end part and a second end part, a first pixel electrode that electrically contacts the first end part of the light emitting element, and a second pixel electrode that electrically contacts the second end part of the light emitting element.

The first bank pattern and the second bank pattern may each include an inorganic material.

The display device may further include a second transistor electrically connected to the first transistor. The second transistor may include a first electrode and a second electrode disposed on the substrate with the second bank pattern interposed therebetween in the thickness direction of the substrate, a second semiconductor pattern electrically connected to the first electrode and the second electrode and disposed on a side surface of the second bank pattern, and a second gate electrode disposed to correspond to the second semiconductor pattern with the second semiconductor pattern and the gate insulating layer interposed therebetween.

The first semiconductor pattern may be disposed along a side surface of the first bank pattern, and the second semiconductor pattern may be disposed along a side surface of the second bank pattern.

The light emitting element may be disposed between another side surface of the first bank pattern and another side surface of the second bank pattern.

The display device may further include a first storage electrode disposed along the another side surface of the first bank pattern and an upper surface of the substrate, and a second storage electrode overlapping the first storage electrode. The first storage electrode and the second storage electrode may form a storage capacitor.

The gate insulating layer may be disposed between the first storage electrode and the second storage electrode.

The first storage electrode may be electrically connected to the first gate electrode.

The second storage electrode may be a first alignment electrode that aligns the light emitting element.

The display device may further include a driving voltage line disposed along the another side surface of the second bank pattern and an upper surface of the substrate, and a second alignment electrode disposed on the driving voltage line.

The display device may further include a first insulating layer overlapping the first alignment electrode and the second alignment electrode.

A second electrode of the first transistor may be electrically connected to the first alignment electrode through a first contact hole of the gate insulating layer, and the first alignment electrode may be electrically connected to the first pixel electrode through a second contact hole of the first insulating layer.

The driving voltage line may be electrically connected to the second alignment electrode through a third contact hole of the gate insulating layer, and the second alignment electrode may be electrically connected to the second pixel electrode through a fourth contact hole of the first insulating layer.

The light emitting element may have a size of a nanoscale to a microscale.

According to an embodiment, a method of manufacturing a display device may include forming a first conductor on a substrate, forming a bank pattern on the substrate and the first conductor to overlap at least a part of the first conductor, forming a second conductor on the substrate and the bank pattern, forming a semiconductor pattern on a side surface of the bank pattern, forming a gate insulating layer to overlap at least a part of the first conductor, the second conductor, and the semiconductor pattern, forming a third conductor on the gate insulating layer, forming a first insulating layer to overlap the third conductor, aligning a light emitting element on the first insulating layer, forming a first pixel electrode to electrically contact a first end part of the light emitting element, and forming a second pixel electrode to electrically contact a second end part of the light emitting element.

The forming of the semiconductor pattern may include forming semiconductor pattern on a side of the bank pattern.

The aligning of the light emitting element may include aligning light emitting element on the first insulating layer corresponding to another side of the bank pattern.

The forming of the gate insulating layer may include etching the gate insulating layer to expose at least a part of an upper surface of the second conductor.

The forming of the first insulating layer may include etching the first insulating layer to expose at least a part of an upper surface of the third conductor.

The third conductor may include a first alignment electrode and a second alignment electrode that aligns the light emitting element, the first pixel electrode may be electrically connected to the first alignment electrode, and the second pixel electrode may be electrically connected to the second alignment electrode.

Advantageous Effects

According to an embodiment, a space restriction in a high-resolution display device or the like may be overcome by efficiently utilizing a space of a pixel area by including a vertical transistor.

In addition, a channel length of a transistor provided in each pixel may be sufficiently secured and a characteristic of the transistor may be prevented from being greatly changed due to a shape change such as bending.

An effect according to an embodiment of the disclosure is not limited to the contents illustrated above, and more various effects are included in the specification.

BRIEF DESCRIPTION OF THE DRAWINGS

The above and other features of the disclosure will become more apparent by describing in further detail embodiments thereof with reference to the accompanying drawings, in which:

FIG. 4 is a cross-sectional view schematically illustrating a display device according to an embodiment;

FIGS. 5 to 18 are cross-sectional views sequentially illustrating a method of manufacturing a display device according to an embodiment;

DETAILED DESCRIPTION OF THE EMBODIMENTS

Figure 1:
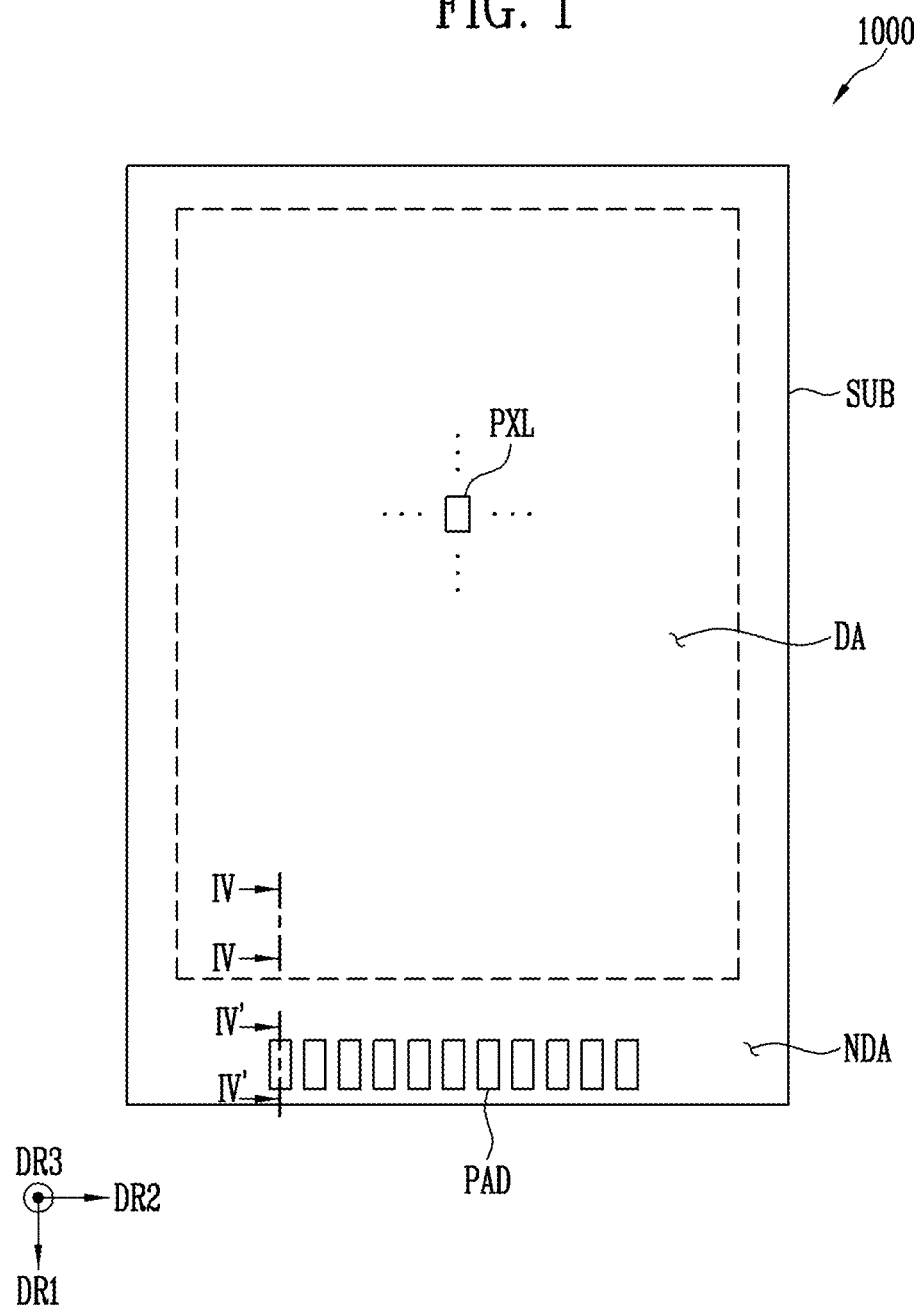
FIG. 1 is a plan view schematically illustrating a display device according to an embodiment.

The disclosure may be modified in various manners and have various forms. Therefore, specific embodiments will be illustrated in the drawings and will be described in detail in the specification. However, it should be understood that the disclosure is not intended to be limited to the disclosed specific forms, and the disclosure includes all modifications, equivalents, and substitutions within the spirit and technical scope of the disclosure.

Terms of "first," "second," and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. The singular expressions include plural expressions unless the context clearly indicates otherwise.

It should be understood that in the present application, a term of "include," "have," or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a part of a layer, a film, an area, a plate, or the like is referred to as being "on" another part, it includes not only a case where the part is "directly on" another part, but also a case where there is further another part between the part and another part. In addition, in the specification, when a part of a layer, a film, an area, a plate, or the like is formed on another part, a forming direction is not limited to an upper direction but includes forming the part on a side surface or in a lower direction. On the contrary, when a part of a layer, a film, an area, a plate, or the like is formed "under" another part, this includes not only a case where the part is "directly beneath" another part but also a case where there is further another part between the part and another part.

The advantages and features of the disclosure and a method of achieving them will become apparent with reference to the embodiments described in detail below together with the accompanying drawings. However, the disclosure is not limited to the embodiments disclosed below, and may be implemented in various different forms. In the following description, a case where a part is connected to another part includes a case where they are electrically connected to each other with another element interposed therebetween as well as a case in which they are directly connected to each other.

Hereinafter, a display device according to an embodiment of the disclosure is described with reference to drawings related to embodiments of the disclosure.

Hereinafter, a horizontal direction is indicated as a first direction DR1, a vertical direction perpendicular to the horizontal direction is indicated as a second direction DR2, and a direction perpendicular to the first direction DR1 and the second direction DR2 is indicated as a third direction DR3.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a plan view schematically illustrating a display device according to an embodiment.

Referring to FIG. 1, a display device 1000 according to an embodiment may include a substrate SUB and pixels PXL provided on the substrate SUB.

The substrate SUB may be implemented as a rigid substrate or a flexible substrate. The substrate SUB may include a transparent insulating material and transmit light. Specifically, the rigid substrate may be one of an organic substrate, a quartz substrate, a glass ceramic substrate, and a crystalline glass substrate. The flexible substrate may be one of a film substrate and a plastic substrate including a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The substrate SUB includes a display area DA displaying an image, and a non-display area NDA surrounding the display area DA without displaying an image.

The display area DA may be an area in which pixels PXL are provided. The non-display area NDA may be an area in which a driver for driving the pixels PXL, a line part electrically connecting the pixels PXL and the driver, and pads PAD are provided.

Figure 2:
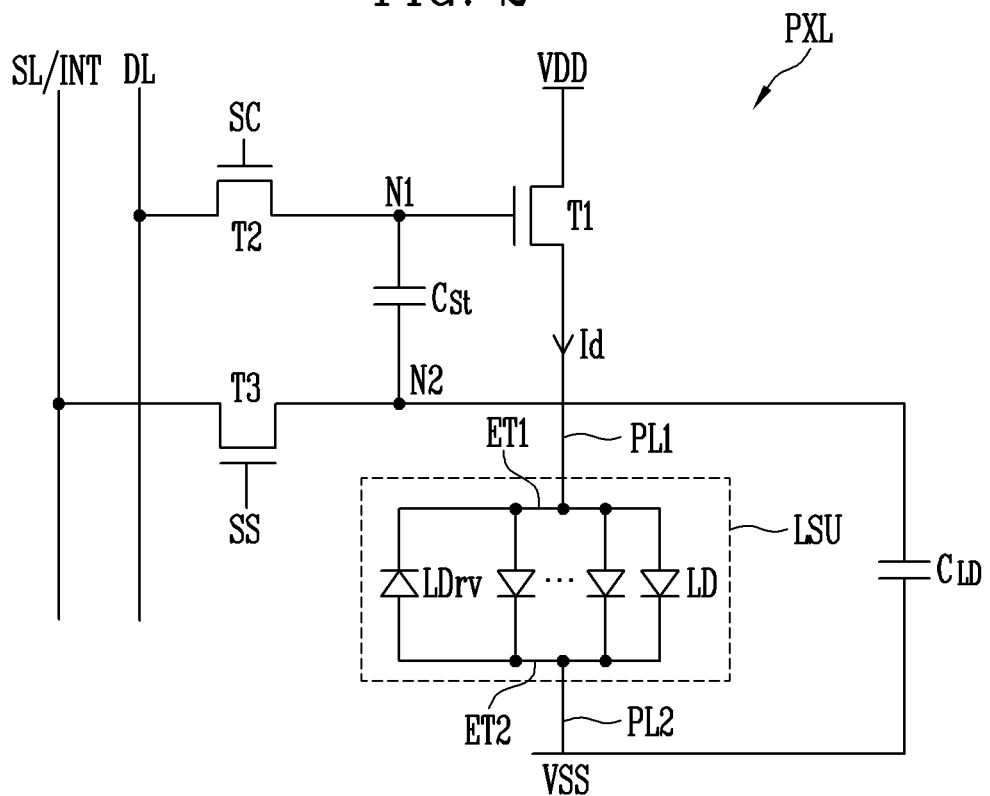
FIG. 2 is a circuit diagram schematically illustrating an electrical connection relationship of components included in a pixel of a display device according to an embodiment.

The pixel PXL may include at least one light emitting element LD of FIG. 2 driven by a predetermined signal (for example, a scan signal, a data signal, or the like) and/or predetermined power (for example, first driving power and second driving power). The light emitting element LD may configure a light source of each pixel PXL. The light emitting element LD may have a size as small as a nanoscale to a microscale and may be electrically connected in parallel to adjacent light emitting elements LD, but the disclosure is not limited thereto.

The driver may provide a predetermined signal and predetermined power to each pixel PXL through the line part, and thus may control driving of the pixel PXL. The driver may include a scan driver, an emission driver, a data driver, and a timing controller.

The line part may electrically connect the driver to the pixels PXL. The line part may be a fan-out line electrically connected to signal lines providing a signal to each pixel PXL and electrically connected to each pixel PXL, for example, a scan line, a data line, and an emission control line. The line part may be a fan-out line electrically connected to signal lines electrically connected to each pixel PXL, for example, a control line, a sensing line, and the like, in order to compensate for a change in electrical characteristic of each pixel PXL in real time.

The pads PAD may be positioned on a side of the display device 1000 and may be electrically connected to a circuit board capable of transmitting signals and voltages from an outside through the line part. As illustrated in FIG. 1, the pads PAD are positioned under the display device 1000, but the disclosure is not limited thereto.

Although FIG. 1 illustrates a pixel PXL, pixels PXL may be substantially provided in the display area DA. In the embodiment, the pixels PXL may be arranged in the display area DA in a stripe arrangement structure or a PENTILE™ arrangement structure, but the disclosure is not limited thereto.

The display device 1000 according to the embodiment may be applied to an electronic device in which a display surface is applied to at least one surface, such as a smartphone, a television, a tablet PC, a mobile phone, a video phone, an e-book reader, a desktop PC, a laptop PC, a netbook computer, a workstation, a server, a personal digital assistant (PDA), a portable multimedia player (PMP), an MP3 player, a medical device, a camera, or a wearable.

Although the display device 1000 according to the embodiment has a rectangular shape having two pairs of sides parallel to each other, the disclosure is not limited thereto. According to an embodiment, the display device may be implemented in various shapes such as a rectangle in which a corner is rounded, a square, a circle, and the like.

Hereinafter, a connection relationship between a pixel of a display device according to an embodiment is described with reference to FIG. 2.

FIG. 2 is a circuit diagram schematically illustrating an electrical connection relationship of components included in a pixel of a display device according to an embodiment.

Referring to FIG. 2, a pixel PXL according to an embodiment may include one or more transistors T1, T2, and T3, one or more capacitors Cst and $C_{LD}$, and a light source unit LSU.

The one or more transistors T1, T2, and T3 include a first transistor T1, a second transistor T2, and a third transistor T3.

The first transistor T1 is a driving transistor for controlling a driving current Id applied to the light source unit LSU, and is electrically connected between first driving power VDD and the light source unit LSU. Specifically, a first electrode of the first transistor T1 is electrically connected to the first driving power VDD, a second electrode of the first transistor T1 is electrically connected to a second node N2, and a gate electrode of the first transistor T1 is electrically connected to a first node N1. The first transistor T1 may control the driving current Id applied from the first driving power VDD to the light source unit LSU through the second node N2, in response to a voltage applied to the first node N1. In an embodiment, the first electrode of the first transistor T1 may be a drain electrode, and the second electrode of the first transistor T1 may be a source electrode, but the disclosure is not limited thereto. According to an embodiment, the first electrode may be a drain electrode, and the second electrode may be a source electrode.

The second transistor T2 is a switching transistor that selects the pixel PXL in response to a scan signal and activates the pixel PXL, and is electrically connected between a data line DL and the first node N1. A first electrode of the second transistor T2 is electrically connected to the data line DL, a second electrode of the second transistor T2 is electrically connected to the first node N1, and a gate electrode of the second transistor T2 is electrically connected to a scan line SC. The second transistor T2 is turned on in case that a scan signal of a gate-on voltage (for example, a high-level voltage) is supplied from the scan line SC, to electrically connect the data line DL and the first node N1. Here, the first node N1 may be a point where the second electrode of the second transistor T2 and the gate electrode of the first transistor T1 are electrically connected, and the second transistor T2 may transmit a data voltage to the gate electrode of the first transistor T1.

The third transistor T3 is a sensing transistor for performing external compensation on the pixel PXL, and is electrically connected between a sensing line SL and the light source unit LSU. A first electrode of the third transistor T3 is electrically connected to the sensing line SL, a second electrode of the third transistor T3 is electrically connected to the second node N2, and a gate electrode of the third transistor T3 is electrically connected to a sensing control line SS. The third transistor T3 is turned on in case that a sensing control signal of a gate-on voltage (for example, a high-level voltage) is supplied from the sensing control line SS, to electrically connect the sensing line SL and the light source unit LSU.

The third transistor T3 may electrically connect the first transistor T1 to the sensing line SL to obtain a sensing signal through the sensing line SL, and may detect a characteristic of each pixel PXL, including a threshold voltage or the like of the first transistor T1 by using the sensing signal. Information on the characteristic of each pixel PXL may be used to convert image data so that a characteristic deviation between the pixels PXL may be compensated for.

The first electrode of the third transistor T3 is electrically connected to initialization power INT. The third transistor T3 may be an initialization transistor capable of initializing the second node N2, and in case that the third transistor T3 is turned on by the sensing control signal, the third transistor T3 may transmit a voltage of the initialization power INT to the second node N2. Accordingly, a second storage electrode of the storage capacitor Cst electrically connected to the second node N2 may be initialized.

The at least one capacitor includes a storage capacitor Cst and a light source capacitor CLD.

A first storage electrode of the storage capacitor Cst is electrically connected to the first node N1, and the second storage electrode is electrically connected to the second node N2. The storage capacitor Cst charges the data voltage corresponding to the data signal supplied to the first node N1 during a frame period. Accordingly, the storage capacitor Cst may store a voltage (for example, the data voltage) of the gate electrode of the first transistor T1.

A first electrode of the light source capacitor $C_{LD}$ is electrically connected to a first pixel electrode ET1 of the light source unit LSU, and a second electrode is electrically connected to a second pixel electrode ET2 of the light source unit LSU. The light source capacitor $C_{LD}$ may store a voltage applied to the first pixel electrode ET1 of the light emitting element LD during a frame.

The light source unit LSU may include a first power line PL1, a second power line PL2, the first pixel electrode ET1, the second pixel electrode ET2, and light emitting elements LD electrically connected between the first pixel electrode ET1 and the second pixel electrode ET2.

A voltage of the first driving power VDD may be applied to the first power line PL1, and a voltage of second driving power VSS may be applied to the second power line PL2.

The first pixel electrode ET1 may be electrically connected to the first driving power VDD through the first transistor T1 and the first power line PL1, and the second pixel electrode ET2 may be electrically connected to the second driving power VSS through the second power line PL2. In an embodiment, the first pixel electrode ET1 may be an anode, and the second pixel electrode ET2 may be a cathode.

Each of the light emitting elements LD included in the light source unit LSU may include one end part (or first end part) electrically connected to the first driving power VDD through the first pixel electrode ET1 and another end part (or second end part) electrically connected to the second driving power VSS through the second pixel electrode ET2.

The first driving power VDD and the second driving power VSS may have different potentials. For example, the first driving power VDD may be set as high-potential power, and the second driving power VSS may be set as low-potential power. In this case, a potential difference between the first driving power VDD and the second driving power VSS may be set to be equal to or greater than a threshold voltage of the light emitting elements LD during an emission period of the pixel PXL.

As described above, the light emitting elements LD electrically connected in parallel in the same direction (for example, a forward direction) between the first pixel electrode ET1 and the second pixel electrode ET2 to which voltages of different potentials are supplied may configure an effective light source. These effective light sources may collectively configure the light source unit LSU of the pixel PXL.

According to an embodiment, the light source unit LSU may further include at least one ineffective light source, for example, a reverse light emitting element LDrv, in addition to the light emitting elements LD configuring each effective light source. The reverse light emitting element LDrv is electrically connected in parallel between the first pixel electrode ET1 and the second pixel electrode ET2 together with the light emitting elements LD configuring the effective light sources, and is electrically connected between the first pixel electrode ET1 and the second pixel electrode ET2 in a direction opposite to the light emitting elements LD. The reverse light emitting element LDrv maintains an inactive state even though a predetermined driving voltage (for example, a forward driving voltage) is applied between the first pixel electrode ET1 and the second pixel electrode ET2, and thus a current substantially does not flow through the reverse light emitting element LDrv.

The light emitting elements LD of the light source unit LSU may emit light with a luminance corresponding to the driving current Id supplied through the first transistor T1. The driving current Id supplied to the light source unit LSU may be divided and flows through each of the light emitting elements LD. Accordingly, while each light emitting element LD emits light with a luminance corresponding to the current flowing therethrough, the light source unit LSU may emit light with a luminance corresponding to the driving current Id.

FIG. 2 illustrates an embodiment in which the first to third transistors T1 to T3 are N-type transistors, but the disclosure is not limited thereto. According to an embodiment, at least one of the first to third transistors T1 to T3 may be changed to a P-type transistor.

FIG. 2 illustrates an embodiment in which the light source unit LSU is electrically connected between the first transistor T1 and the second driving power VSS, the light source unit LSU may be electrically connected between the first driving power VDD and the first transistor T1.

FIG. 2 illustrates an embodiment in which light emitting elements LD configuring each light source unit LSU are electrically connected in parallel, but the disclosure is not limited thereto. According to an embodiment, the light source unit LSU may be configured to include at least one serial stage including light emitting elements LD connected in parallel to each other. For example, the light source unit LSU may be configured in a series/parallel mixed structure.

As the display device is implemented with a high resolution, a size of each pixel area in which the pixel PXL is positioned is gradually reduced. However, there may be a limit in reducing a size of the first, second, and third transistors T1, T2, and T3 and/or the storage capacitor Cst in order to secure a characteristic condition required for the display device. In case that one or more transistors, capacitors, and/or the like are further included in the pixel PXL, a space required by the pixel PXL may be further increased. Accordingly, the disclosure discloses various embodiments related to a pixel structure that may efficiently utilize a limited pixel area, and a detailed description thereof is described below.

Hereinafter, a structure of the light emitting element described above is described with reference to FIG. 3.

Figure 3:
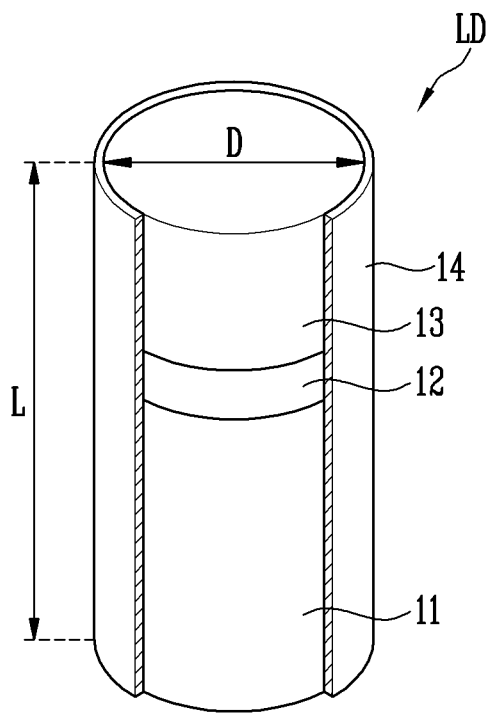
FIG. 3 is a perspective view schematically illustrating a light emitting element included in a pixel of a display device according to an embodiment.
Figure 11:
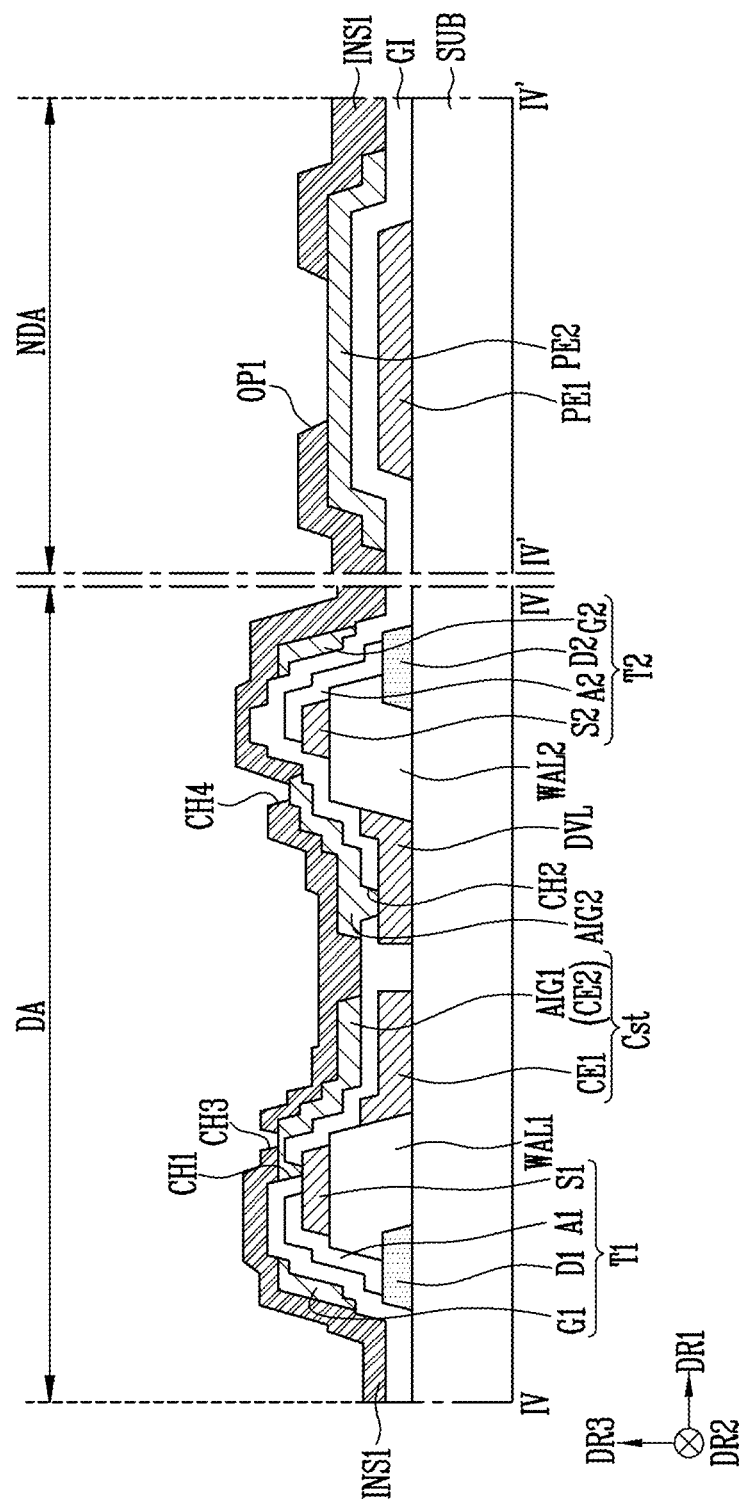
Figure 12:
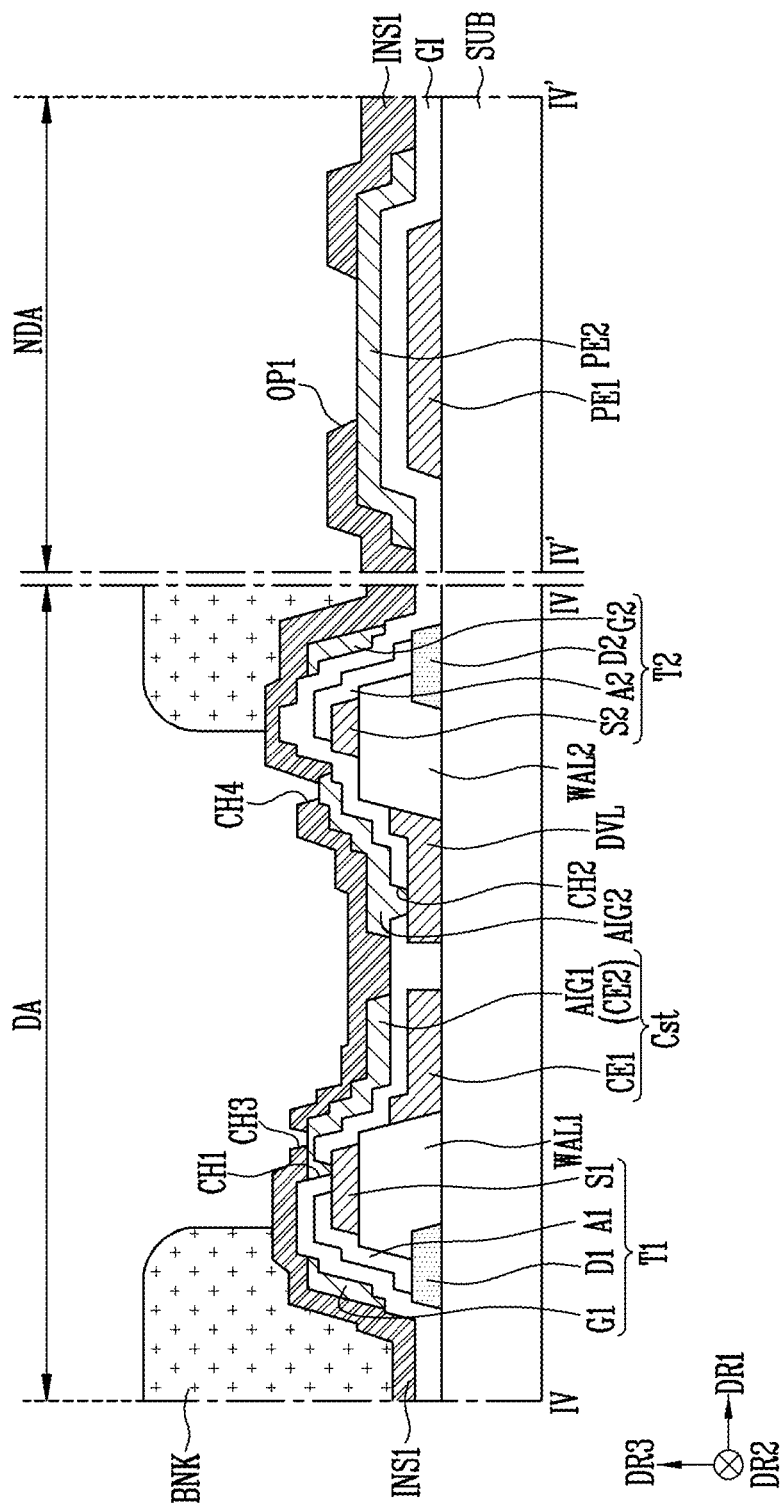
Figure 13:
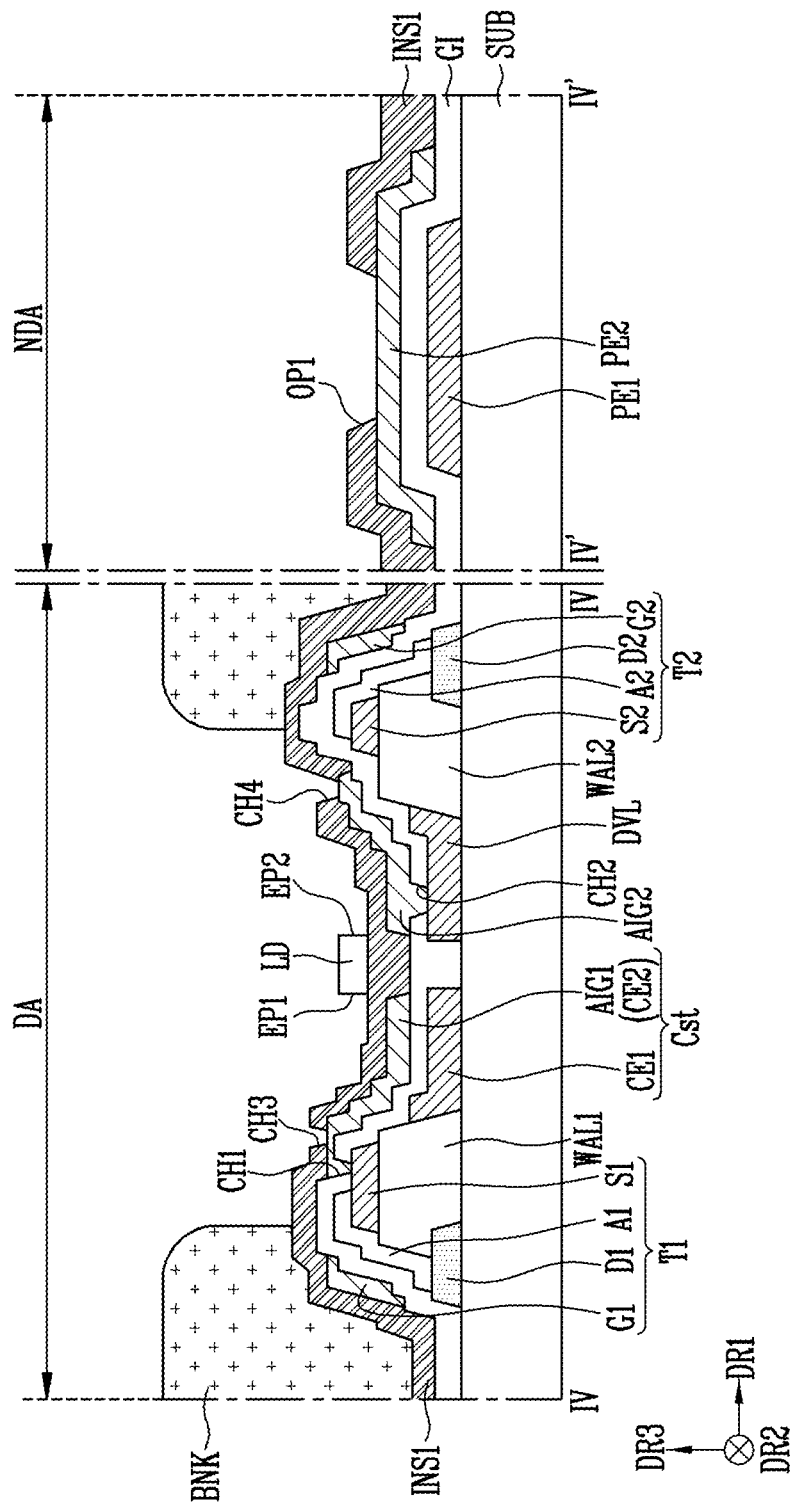
Figure 14:
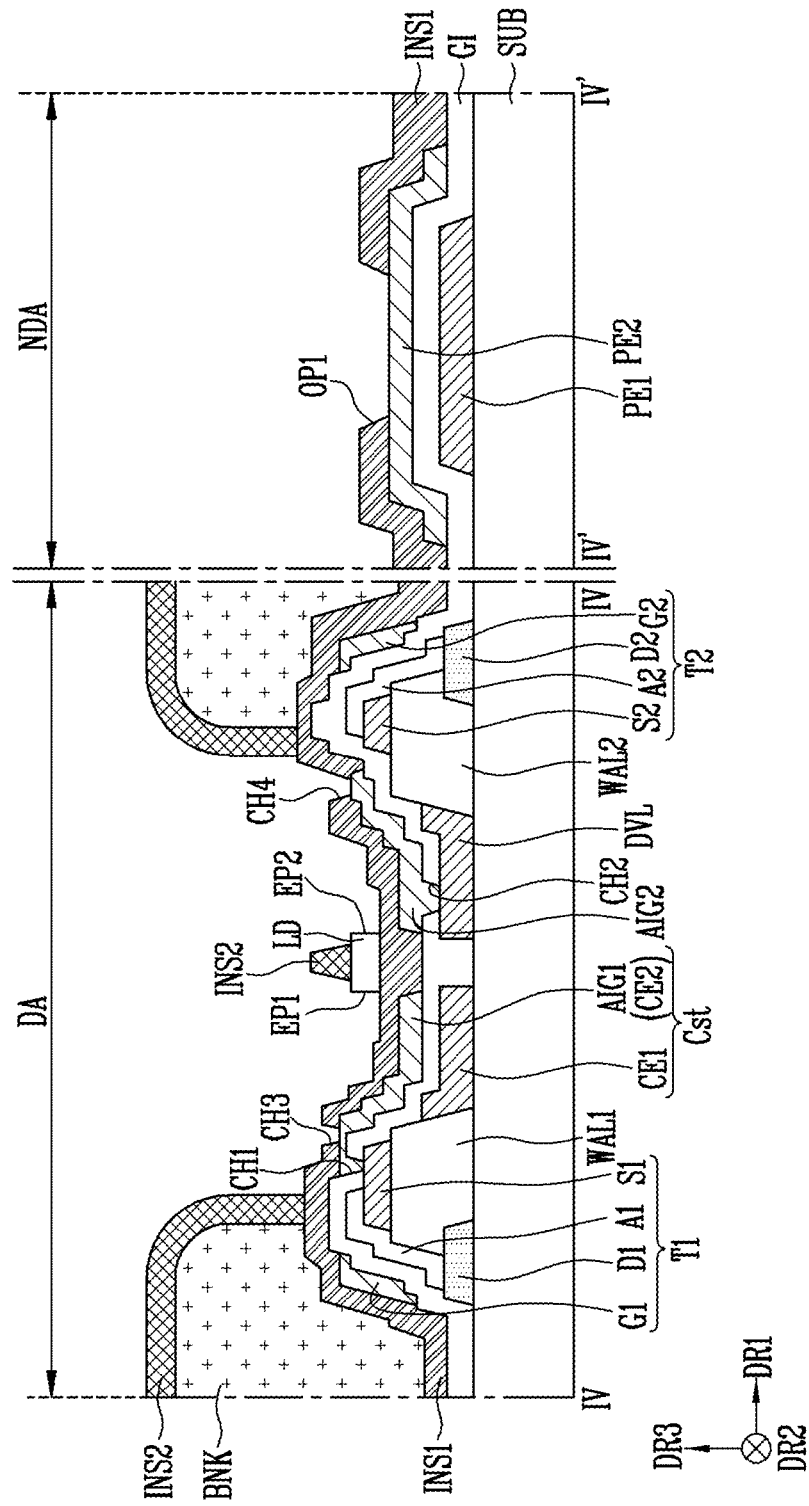
Figure 15:
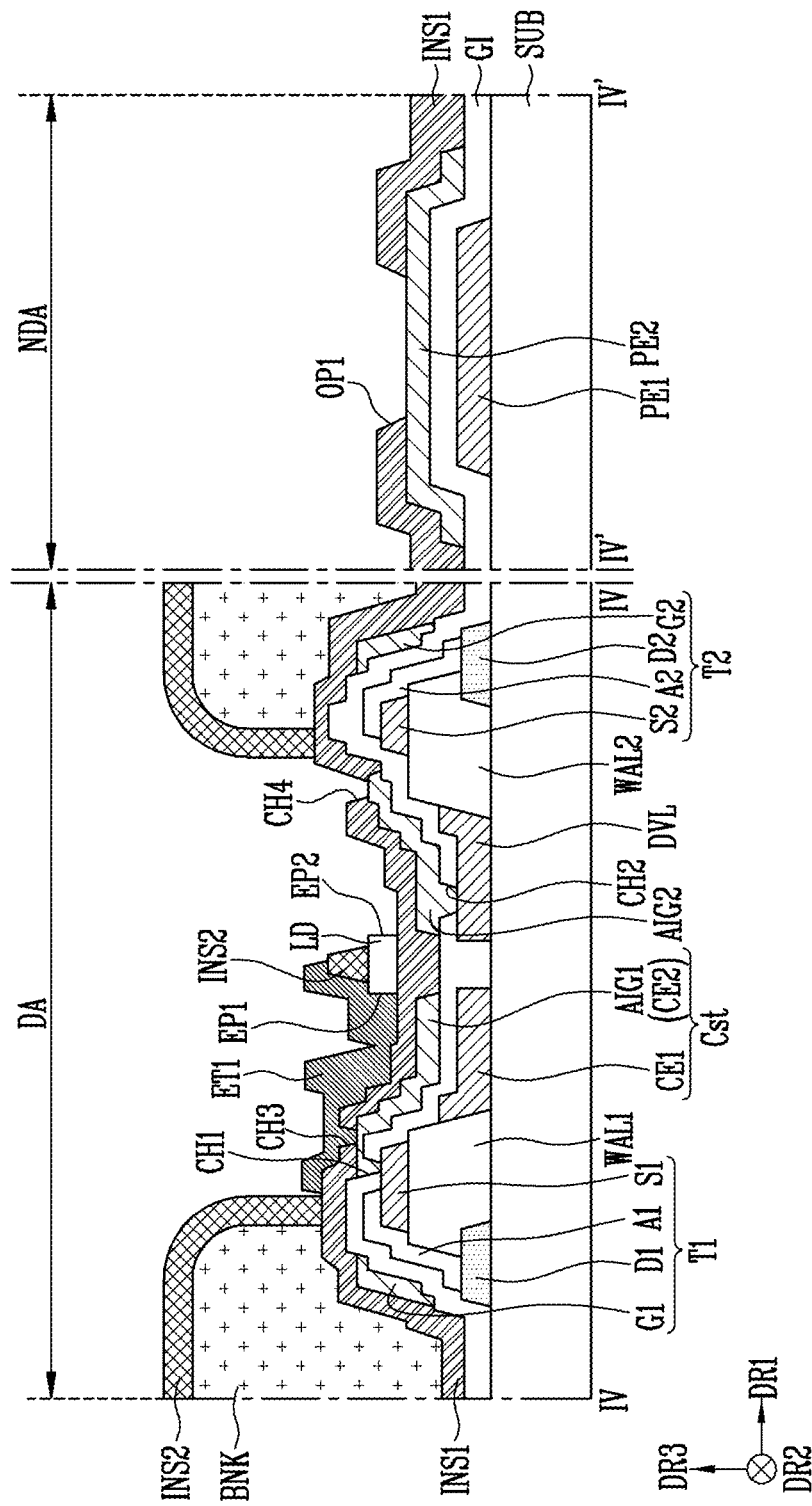
Figure 16:
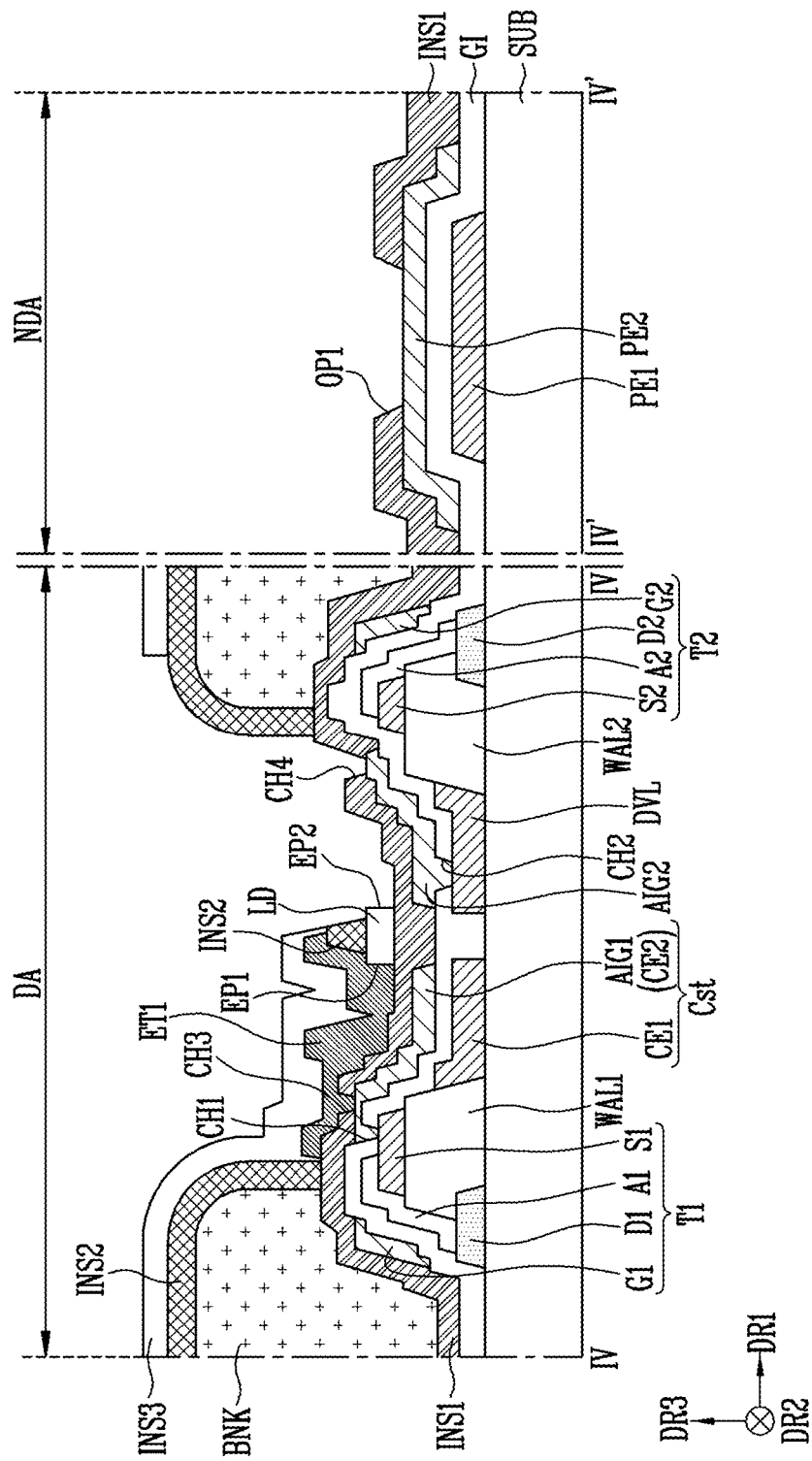
Figure 17:
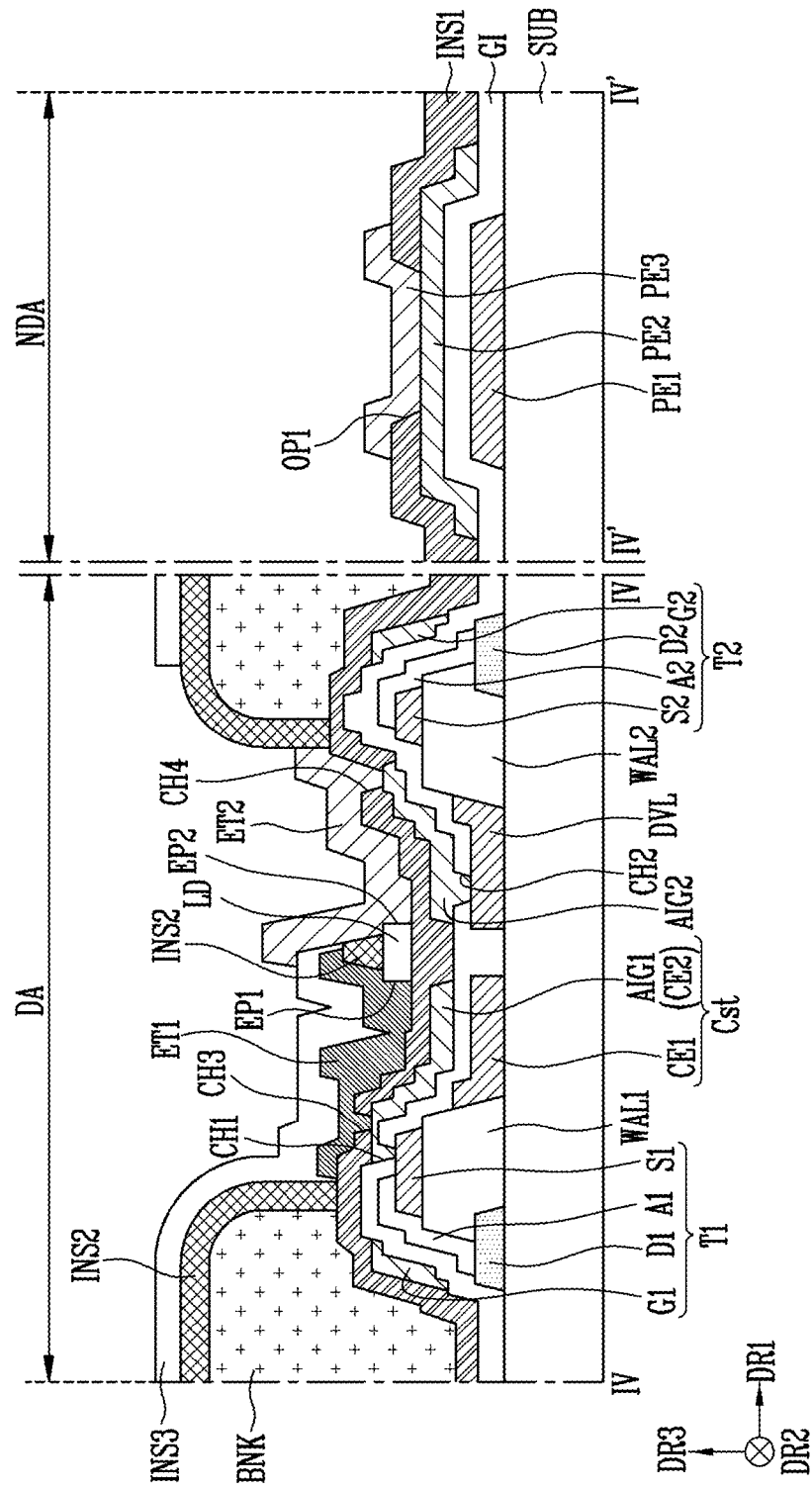
Figure 18:
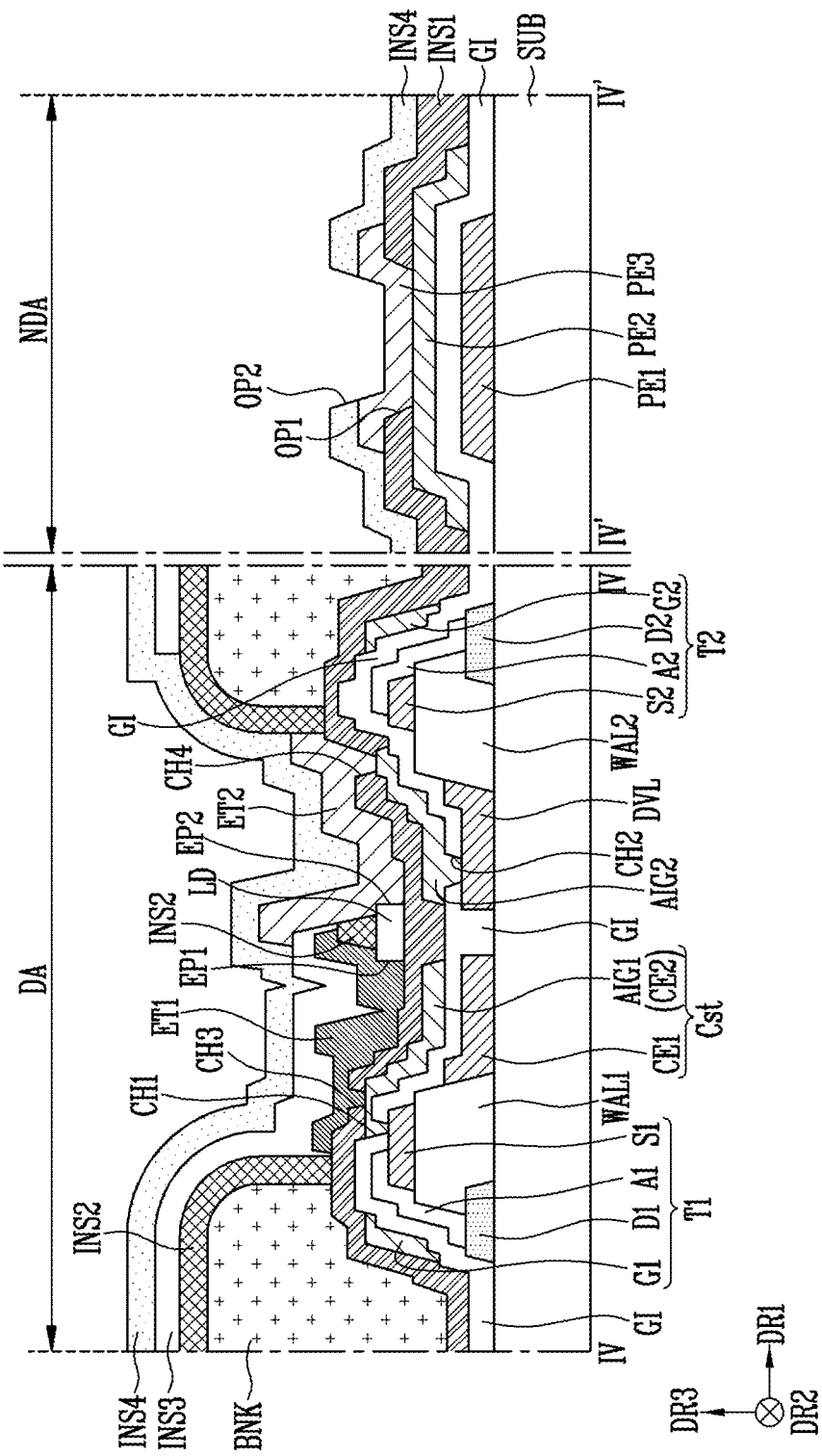

FIG. 3 is a perspective view schematically illustrating a light emitting element included in a pixel of a display device according to an embodiment. FIG. 3 illustrates a light emitting element of a column shape, but a type and/or a shape of the light emitting element according to the disclosure is not limited thereto.

Referring to FIG. 3, the light emitting element LD according to an embodiment includes a first semiconductor layer 11, a second semiconductor layer 13, and an active layer 12 positioned between the first semiconductor layer 11 and the second semiconductor layer 13. For example, the light emitting element LD may be configured as a stack in which the first semiconductor layer 11, the active layer 12, and the second semiconductor layer 13 are sequentially stacked in a length direction (L).

In case that an extension direction of the light emitting element LD is referred to as the length direction (L), the light emitting element LD may have one end part (or first end part) and another end part (second end part) in the length direction (L). According to an embodiment, one of the first semiconductor layer 11 and the second semiconductor layer 13 may be disposed at one end part (or first end part) of the light emitting element LD, and the other of the first semiconductor layer 11 the second semiconductor layer 13 may be disposed at the another end part (or second part) of the light emitting element LD.

According to an embodiment, the light emitting element LD may be a rod-shaped light emitting diode manufactured in a rod shape. In the specification, the term "rod-shaped" refers to a rod-like shape or a bar-like shape that is long (for example, having an aspect ratio greater than 1) in the length direction (L), such as a circular column shape or a polygonal column shape, and a shape of a cross section thereof is not particularly limited. For example, a length L of the light emitting element LD may be greater than a diameter D (or a width of the cross section) thereof.

According to an embodiment, the light emitting element LD may have a size as small as a nanoscale to a microscale. Each light emitting element LD may have the diameter D and/or the length L of a nanoscale to microscale range. For example, the length L of the light emitting element LD may range from about 100 nm to about 10 the diameter D thereof may range from about 2 μm to about 6 and an aspect ratio thereof may be in a range of about 1.2 to about 100. However, the size of the light emitting element LD is not limited thereto. For example, the size of the light emitting element LD may be variously changed according to design conditions of various devices using a light emitting device using the light emitting element LD as a light source, for example, a display device or the like.

The first semiconductor layer 11 may include at least one n-type semiconductor layer. For example, the first semiconductor layer 11 may include any semiconductor material among InAlGaN, GaN, AlGaN, InGaN, AlN, and InN, and may include an n-type semiconductor layer doped with a first conductive dopant such as Si, Ge, or Sn. However, the material configuring the first semiconductor layer 11 is not limited thereto, and various other materials may configure the first semiconductor layer 11.

The active layer 12 may be disposed on the first semiconductor layer 11 and may be formed in a single or multiple quantum well structure. In an embodiment, a clad layer doped with a conductive dopant may be formed on and/or under the active layer 12. For example, the clad layer may be formed of an AlGaN layer or an InAlGaN layer. According to an embodiment, a material such as AlGaN or InAlGaN may be used to form the active layer 12, and various other materials may configure the active layer 12.

In case that a voltage equal to or greater than a threshold voltage is applied to both ends of the light emitting element LD, the light emitting element LD emits light while electron-hole pairs are combined in the active layer 12. By controlling light emission of the light emitting element LD using such a principle, the light emitting element LD may be used as a light source of various light emitting devices including the pixel PXL of the display device.

The second semiconductor layer 13 may be disposed on the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material among InAlGaN, GaN, AlGaN, InGaN, AlN, and InN and may include a p-type semiconductor layer doped with a second conductive dopant such as Mg, Zn, Ca, Sr, or Ba. However, the material configuring the second semiconductor layer 13 is not limited thereto, and various other materials may configure the second semiconductor layer 13.

In the above-described embodiment, each of the first semiconductor layer 11 and the second semiconductor layer 13 is configured of one layer, but the disclosure is not limited thereto. In an embodiment, depending on the material of the active layer 12, each of the first semiconductor layer 11 and the second semiconductor layer 13 may further include one or more layers, for example, a clad layer and/or a tensile strain barrier reducing (TSBR) layer. The TSBR layer may be a strain alleviating layer disposed between semiconductor layers of which lattice structures are different to serve as a buffer for reducing a lattice constant difference. The TSBR layer may be configured of a p-type semiconductor layer such as p-GaInP, p-AlInP, or p-AlGaInP, but the disclosure is not limited thereto.

According to an embodiment, the light emitting element LD further includes an insulating layer 14 provided on a surface. The insulating layer 14 may be formed on the surface of the light emitting element LD to surround an outer circumferential surface of the active layer 12, and may further surround a region of the first semiconductor layer 11 and the second semiconductor layer 13. According to an embodiment, the insulating layer 14 may not cover and expose one end (or first end) of each of the first semiconductor layer 11 and the second semiconductor layer 13 positioned at both ends of the light emitting element LD in the length direction (L), for example, two bottom surfaces of a cylinder (an upper surface and a lower surface of the light emitting element LD).

According to an embodiment, the insulating layer 14 may include at least one insulating material selected from the group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium strontium oxide. ($SrTiO_x$), cobalt oxide ($CoxO_y$), magnesium oxide (MgO), zinc oxide (ZnO), ruthenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, InxOy:H, niobium oxide ($Nb_xO_y$), magnesium fluoride ($MgF_x$), aluminum fluoride ($AF_x$), alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), vanadium nitride (VN), and the like, but the disclosure is not limited thereto, and various materials having an insulating property may be used as the material of the insulating layer 14. For example, the material of the insulating layer 14 is not particularly limited, and the insulating layer 14 may be configured of various insulating materials.

The insulating layer 14 may be provided in a form of a single layer or may be provided in a form of a multilayer including at least a double layer. For example, in case that the insulating layer 14 is configured as a double layer including a first layer and a second layer sequentially stacked, the first layer and the second layer may be configured of different materials (or substances), and may be formed by different processes. According to an embodiment, the first layer and the second layer may include the same material (or substance).

In an embodiment, the light emitting element LD may further include an additional component in addition to the first semiconductor layer 11, the active layer 12, the second semiconductor layer 13, and the insulating layer 14. For example, the light emitting element LD may additionally include one or more phosphor layers, active layers, semiconductor layers, and/or electrodes disposed on one end side (or first end side) of the first semiconductor layer 11, the active layer 12, and the second semiconductor layer 13.

An electrode that may be disposed on one side (or first side) of the light emitting element LD may be an ohmic contact electrode or a Schottky contact electrode, but is not limited thereto. The electrode may include a metal or a metal oxide, for example, Cr, Ti, Al, Au, Ni, ITO, IZO, ITZO, and an oxide, an alloy, or the like thereof may be used alone or in combination. According to an embodiment, the electrode may be substantially transparent or translucent. Accordingly, light generated from the light emitting element LD may pass through the electrode to be emitted to the outside of the light emitting element LD.

In case that the insulating layer 14 is provided on a surface of the light emitting element LD, in particular, a surface of the active layer 12, the active layer 12 may be prevented from being short-circuited with at least one electrode or the like (for example, at least one contact electrode among contact electrodes electrically connected to both ends of the light emitting element LD) which is not shown. Accordingly, electrical stability of the light emitting element LD may be secured.

As the insulating layer 14 is formed on the surface of the light emitting element LD, a surface defect of the light emitting element LD may be minimized, and thus the lifespan and efficiency may be improved. In case that the insulating layer 14 is formed on each light emitting element LD, even though light emitting elements LD are disposed close to each other, occurrence of an unwanted short circuit between the light emitting elements LD may be prevented.

In an embodiment, the light emitting element LD may be manufactured through a surface treatment. For example, the surface treatment may be performed on each light emitting element LD so that in case that light emitting elements LD are mixed in a fluidic solution (or solvent) and supplied to each emission area (for example, an emission area of each pixel), the light emitting elements LD may be uniformly dispersed in the solution without being un-uniformly aggregated.

Hereinafter, a detailed structure of a display device according to an embodiment is described with reference to FIG. 4.

FIG. 4 is a cross-sectional view schematically illustrating a display device according to an embodiment. Specifically, FIG. 4 is a schematic cross-sectional view taken along lines IV-IV and IV'-IV' of FIG. 1. FIG. 4 illustrates a structure of the pixel PXL of a partial area in the display area DA and a structure of the pad PAD of a partial area in the non-display area NDA. Although FIG. 4 illustrates a cross-sectional view taken along the first direction DR1 in FIG. 1, the disclosure is not limited thereto. Lines IV-IV and IV'-IV' of FIG. 4 may be positioned in the second direction DR2 in FIG. 1, and the cross-sectional view of FIG. 4 may be a cross-sectional view taken along the second direction DR2 in FIG. 1.

Referring to FIG. 4, the display device according to an embodiment may include a substrate SUB, a first conductor SD1, a partition wall WAL, a second conductor SD2, a semiconductor layer, a third conductor SD3, a bank BNK, a light emitting element LD, a first pixel electrode ET1, a second pixel electrode ET2, and insulating layers GI, INS1, INS2, INS3, and INS4.

The substrate SUB may be a rigid substrate or a flexible substrate, may include a transparent insulating material, and may transmit light.

A buffer layer capable of preventing an impurity from being diffused into a transistor which is described below may be positioned on the substrate SUB. The buffer layer may be an inorganic insulating layer configured of a single layer or multiple layers including at least one of metal oxides such as silicon nitride ($SiN_x$), silicon oxide ($SiO_x$), silicon oxynitride ($SiO_xN_y$), and aluminum oxide ($AlO_x$).

The transistor includes a first transistor T1 and a second transistor T2 electrically connected to the first transistor T1. The first transistor T1 may correspond to the driving transistor T1 described with reference to FIG. 2, and the second transistor T2 may correspond to the switching transistor T2 described with reference to FIG. 2.

The first transistor T1 and the second transistor T2 may include semiconductor patterns A1 and A2, gate electrodes G1 and G2, first electrodes D1 and D2, and second electrodes S1 and S2, respectively. In an embodiment, the first electrode may be a drain electrode, and the second electrode may be a source electrode, but the disclosure is not limited thereto. According to an embodiment, the first electrode may be a source electrode, and the second electrode may be a drain electrode.

The first conductor SD1 may be positioned on the substrate SUB and may include the first electrode of the transistor. In an embodiment, the first conductor SD1 includes the first electrode D1 of the first transistor T1 and the first electrode D2 of the second transistor T2.

The partition wall (or bank pattern) WAL is positioned on the first conductor SD1 and the substrate SUB. The partition wall WAL may be formed of a material including an inorganic material. For example, the partition wall WAL may include at least one of metal oxides such as silicon nitride ($SiN_x$), silicon oxide ($SiO_x$), silicon oxynitride ($SiO_xN_y$), and aluminum oxide ($AlO_x$).

The partition wall WAL may have a trapezoidal shape or a rectangular shape in which a width of an upper side (or an upper surface) is smaller than a width of a lower side (or a lower surface) in a cross-sectional view, but the disclosure is not limited thereto. According to an embodiment, the partition wall WAL may include a curved surface having a cross section of a semi-elliptical shape, a semi-circular shape (or a semi-spherical shape), or the like. The shape of the partition wall WAL is not limited to those in the above-described embodiments, and may be variously implemented according to shapes of the first electrode D1 of the first transistor T1 and the first electrode D2 of the second transistor T2.

The partition wall WAL includes a first partition wall (or first bank pattern) WAL1 and a second partition wall (or second bank pattern) WAL2. The first partition wall WAL1 may be positioned to at least partially overlap the first electrode D1 of the first transistor T1, and the second partition wall WAL2 may be positioned to at least partially overlap the first electrode D2 of the second transistor T2.

The first partition wall WAL1 may separate the first electrode D1 from the second electrode S1 of the first transistor T1, and the second partition wall WAL2 may separate the first electrode D2 and the second electrode S2 of the second transistor T2. For example, the first partition wall WAL1 may maintain a distance between the first electrode D1 and the second electrode S1 of the first transistor T1, and the second partition wall WAL2 may maintain a distance between the first electrode D2 and the second electrode S2 of the second transistor T2. The first partition wall WAL1 may be referred to as a first spacer, and the second partition wall WAL2 may be referred to as a second spacer.

The second conductor SD2 is positioned on the partition wall WAL and/or the substrate SUB. The second conductor SD2 includes the second electrode S1 of the first transistor T1, the second electrode S2 of the second transistor T2, a first storage electrode CE1, a driving voltage line DVL, and a first pad electrode PE1.

The second electrode S1 of the first transistor T1, the second electrode S2 of the second transistor T2, the first storage electrode CE1, and the driving voltage line DVL may be positioned in a partial area of the display area DA. The first pad electrode PE1 may be positioned in a partial area of the non-display area NDA.

Each of the second electrode S1 of the first transistor T1 and the second electrode S2 of the second transistor T2 may be positioned on an upper surface of the partition wall WAL. For example, the second electrode S1 of the first transistor T1 may be positioned to be spaced apart from the first electrode D1 of the first transistor T1 in a thickness direction (or the third direction DR3) of the substrate SUB with the first partition wall WAL1 interposed therebetween, and the second electrode S2 of the second transistor T2 may be positioned to be spaced apart from the first electrode D2 of the second transistor T2 in the thickness direction (or the third direction DR3) of the substrate SUB with the second partition wall WAL2 interposed therebetween.

The first storage electrode CE1 is spaced apart from the second electrode S1 of the first transistor T1 and is directly positioned on an upper surface of the substrate SUB. In an embodiment, the first storage electrode CE1 may be positioned on another side surface of the first partition wall WAL1 and the upper surface of the substrate SUB.

The first storage electrode CE1 may configure the storage capacitor Cst together with a second storage electrode CE2 which is described below. Although not shown in the drawings, the first storage electrode CE1 may be electrically connected to a first gate electrode G1 of the first transistor T1, which is described below, through an external line. Accordingly, as described with reference to FIG. 2, the storage capacitor Cst may store a voltage (for example, the data voltage) of the gate electrode of the first transistor T1.

The driving voltage line DVL is spaced apart from the second electrode S2 of the second transistor T2 and is directly positioned on the upper surface of the substrate SUB. In an embodiment, the driving voltage line DVL may be positioned on another side surface of the second partition wall WAL2 and the upper surface of the substrate SUB. For example, the driving voltage line DVL and the first storage electrode CE1 may face each other between the first partition wall WAL1 and the second partition wall WAL2 and may be positioned to be spaced apart from each other.

The driving voltage line DVL may be the same configuration as the second power line PL2 described with reference to FIG. 2. Accordingly, a voltage of the second driving power VSS (FIG. 2) may be applied to the driving voltage line DVL.

Although not shown in the drawings, the display device may further include a first power line electrically connected to the first driving power VDD (FIG. 2). The first power line may be electrically connected to a first pixel electrode ET1 which is described below, and the driving voltage line DVL may be electrically connected to a second pixel electrode ET2 which is described below.

The first pad electrode PE1 may be a part of an electrode of the pad PAD (FIG. 1) and may be directly positioned on the upper surface of the substrate SUB. According to an embodiment, the first pad electrode PE1 may be omitted.

The semiconductor layer is positioned on a side surface of the partition wall WAL. The semiconductor layer is positioned between the first electrodes D1 and D2 and the second electrodes S1 and S2 of the transistor, and is positioned to at least partially overlap the first electrodes D1 and D2 and the second electrodes S1 and S2.

The semiconductor layer includes a first semiconductor pattern A1 of the first transistor T1 and a second semiconductor pattern A2 of the second transistor T2.

The first semiconductor pattern A1 may be positioned on a side surface of the first partition wall WAL1 between the first electrode D1 and the second electrode S1 of the first transistor T1. The second semiconductor pattern A2 may be positioned on a side surface of the second partition wall WAL2 between the first electrode D2 and the second electrode S2 of the second transistor T2.

Each of the first semiconductor pattern A1 and the second semiconductor pattern A2 may include a drain region electrically connected to the first electrodes D1 and D2, a source region electrically connected to the second electrodes S1 and S2, and a channel region between the drain region and the source region. The channel region may overlap the first gate electrode G1 and the second gate electrode G2, respectively.

In an embodiment, the drain region of the first semiconductor pattern A1 and the second semiconductor pattern A2 may directly contact the first electrodes D1 and D2, and the source region of the first semiconductor pattern A1 and the second semiconductor pattern A1 may directly contact the second electrodes S1 and S2.

According to an embodiment, the drain region of the first semiconductor pattern A1 and the second semiconductor pattern A2 may be physically and/or electrically connected to the first electrodes D1 and D2 through a contact hole passing through the insulating layer, and the source region of the first semiconductor pattern A1 and the second semiconductor pattern A2 may be physically and/or electrically connected to the second electrodes S1 and S2 through a contact hole passing through the insulating layer. The first semiconductor pattern A1 and the second semiconductor pattern A2 may be semiconductor patterns formed of polysilicon, amorphous silicon, an oxide semiconductor, or the like.

Each of the first semiconductor pattern A1 and the second semiconductor pattern A2 may be disposed in a diagonal direction with respect to a plane extending in the first direction DR1 and the second direction DR2 based on the substrate SUB, and may configure a vertical channel. Each of the first semiconductor pattern A1 and the second semiconductor pattern A2 configuring the vertical channel may secure a channel length in a lateral direction of the corresponding partition wall WAL. Accordingly, the first transistor T1 and the second transistor T2 may have a reduced area occupied by the first transistor T1 and the second transistor T2 in each pixel area regardless of the channel length of the semiconductor pattern. According to an embodiment, by configuring the first transistor T1 and the second transistor T2 as vertical transistors, a space of the pixel area may be efficiently utilized. For example, a pixel structure according to an embodiment may be usefully applied to a high-resolution display device or the like.

A change in characteristics of the first transistor T1 and the second transistor T2 having the vertical channel may not occur or may be insignificant even though a shape thereof is deformed, for example, bent or folded, compared to transistors having a horizontal channel arranged in parallel on a plane extending in the first direction DR1 and the second direction DR2 based on the substrate SUB.

The gate insulating layer GI is positioned on the semiconductor layer to cover (or overlap) the first conductor SD1, the semiconductor layer, the second conductor SD2, and the substrate SUB.

The gate insulating layer GI may partially expose an upper surface of the second electrode S1 of the first transistor T1. The exposed upper surface of the second electrode S1 of the first transistor T1 may be physically and/or electrically connected to a first alignment electrode AIG1, which is described below, through a first contact hole CH1. The gate insulating layer GI may partially expose an upper surface of the driving voltage line DVL. The exposed upper surface of the driving voltage line DVL may be physically and/or electrically connected to a second alignment electrode AIG2, which is described below, through a second contact hole CH2.

The gate insulating layer GI may be an inorganic insulating layer including an inorganic material. For example, the gate insulating layer GI may include at least one of metal oxides such as silicon nitride ($SiN_x$), silicon oxide ($SiO_x$), silicon oxynitride ($SiO_xN_y$), and aluminum oxide ($AlO_x$). According to an embodiment, the gate insulating layer GI may be formed of an organic insulating layer including an organic material. The gate insulating layer GI may be provided as a single layer, or may be provided as multiple layers of two or more layers.

The third conductor SD3 is disposed on the gate insulating layer GI. The third conductor SD3 may be configured as a single layer including a material selected from a group consisting of copper (Cu), molybdenum (Mo), tungsten (W), aluminum neodymium (AlNd), titanium (Ti), aluminum (Al), silver (Ag), and an alloy thereof alone or a mixture thereof. The third conductor SD3 may be configured in a double layer or multi-layer structure of molybdenum (Mo), titanium (Ti), copper (Cu), aluminum (Al), or silver (Ag), which is a low-resistance material.

The third conductor SD3 includes the first gate electrode G1 of the first transistor T1, the second gate electrode G2 of the second transistor T2, the first alignment electrode AIG1 (or the second storage electrode CE2), the second alignment electrode AIG2, and a second pad electrode PE2.

The first gate electrode G1 of the first transistor T1, the second gate electrode G2 of the second transistor T2, the first alignment electrode AIG1 (or the second storage electrode CE2), the second alignment electrode AIG2 may be positioned in a partial area of the display area DA, and the second pad electrode PE2 may be positioned in a partial area of the non-display area NDA.

The first gate electrode G1 of the first transistor T1 is positioned on the gate insulating layer GI positioned on a side surface of the first partition wall WAL1 to correspond to the first semiconductor pattern A1.

The second gate electrode G2 of the second transistor T2 is positioned on the gate insulating layer GI positioned on a side surface of the second partition wall WAL2 to correspond to the second semiconductor pattern A2.

The first alignment electrode AIG1 is positioned on the gate insulating layer GI to correspond to the first storage electrode CE1. The first alignment electrode AIG1 may be for aligning the light emitting element LD together with the second alignment electrode AIG2, and a voltage for aligning the light emitting element LD may be applied to the first alignment electrode AIG1 and the second alignment electrode AIG2.

The first alignment electrode AIG1 configures the storage capacitor Cst together with the first storage electrode CE1 in a part overlapping the first storage electrode CE1 with the gate insulating layer GI interposed therebetween. In this case, the first alignment electrode AIG1 may be referred to as the second storage electrode CE2. The storage capacitor Cst may correspond to the storage capacitor Cst described with reference to FIG. 2.

According to an embodiment, the second storage electrode CE2 configuring the storage capacitor Cst may be integral with the first alignment electrode AIG1, and thus a space in which the storage capacitor Cst is formed may be reduced. Accordingly, efficiency of space utilization in the pixel area where the pixel PXL is positioned may be increased, and thus it may be usefully applied to a display device implemented in a high resolution.

The second alignment electrode AIG2 is positioned on the gate insulating layer GI to correspond to the driving voltage line DVL. The second alignment electrode AIG2 may be physically and/or electrically connected to the driving voltage line DVL through the second contact hole CH2 formed in the gate insulating layer GI.

The second pad electrode PE2 is an electrode configuring a part of the electrodes of the pad PAD and is positioned on the gate insulating layer GI to correspond to the first pad electrode PE1.

The first insulating layer INS1 is disposed on the third conductor SD3 to cover (or overlap) the gate insulating layer GI and the third conductor SD3.

The first insulating layer INS1 may include an inorganic insulating layer formed of an inorganic material or an organic insulating layer formed of an organic material. For example, the first insulating layer INS1 may include at least one of metal oxides such as silicon nitride ($SiN_x$), silicon oxide ($SiO_x$), silicon oxynitride ($SiO_xN_y$), and aluminum oxide ($AlO_x$), but the disclosure is not limited thereto. The first insulating layer INS1 may be formed of an inorganic insulating layer advantageous in protecting the light emitting element LD.

The first insulating layer INS1 may partially expose an upper surface of the first alignment electrode AIG1. The exposed upper surface of the first alignment electrode AIG1 may be physically and/or electrically connected to the first pixel electrode ET1, which is described below, through a third contact hole CH3.

The first insulating layer INS1 may partially expose an upper surface of the second alignment electrode AIG2. The exposed upper surface of the second alignment electrode AIG2 may be physically and/or electrically connected to the second pixel electrode ET2, which is described below, through a fourth contact hole CH4.

In the non-display area NDA, the first insulating layer INS1 may partially expose an upper surface of the second pad electrode PE2. The exposed second pad electrode PE2 may be physically and/or electrically connected to a third pad electrode PE3, which is described below, through a first opening OP1.

The bank BNK is positioned on the first insulating layer INS1 in the display area DA. The bank BNK may be a structure defining (or partitioning) the pixel area or the emission area of the corresponding pixel PXL and adjacent pixels PXL adjacent thereto. In a step of supplying the light emitting elements LD, the bank BNK may be a dam structure that prevents a solution in which the light emitting elements LD are mixed from flowing into the adjacent pixel PXL or controls to supply a predetermined amount of solution to each pixel PXL area.

The bank BNK may be configured to include at least one light blocking material and/or reflective material to prevent a light leakage defect between the corresponding pixel PXL and the pixels PXL adjacent thereto. According to an embodiment, the bank BNK may include a transparent material (or substance). The transparent material may include, for example, polyamides resin, polyimides resin, and the like, but the disclosure is not limited thereto. According to an embodiment, a reflective material layer (or reflective layer) may be separately provided and/or formed on the bank BNK to further improve efficiency of light emitted from each pixel PXL.

The light emitting element LD is positioned on the first insulating layer INS1. The light emitting element LD may be positioned on the first insulating layer INS1 between the banks BNK so that the length direction (see "L" in FIG. 3) is parallel to the first direction DR1.

In an embodiment, the light emitting element LD may be positioned on the first insulating layer INS1 positioned between another side surface of the first partition wall WALL and another side surface of the second partition wall WAL2. Since the light emitting element LD is positioned on a side surface different from each of the first semiconductor pattern A1 and the second semiconductor pattern A2 with the first partition wall WALL and the second partition wall WAL2 interposed therebetween, the light emitting element LD may not affect the first semiconductor pattern A1 and the second semiconductor pattern A2 in a formation process by an inkjet printing device.

In a step of supplying the light emitting elements LD, the first partition wall WALL and the second partition wall WAL2 may prevent a solution in which the light emitting elements LD are mixed from flowing into the adjacent pixel PXL, or control to supply a predetermined amount of solution to each pixel PXL area. The partition wall WALL and the second partition wall WAL2 may serve as a dam structure together with the above-described bank BNK.

The first end part EP1 of the light emitting element LD may be positioned to at least partially overlap an edge of the first alignment electrode AIG1, and the second end part EP2 of the light emitting element LD may be positioned to at least partially overlap an edge of the second alignment electrode AIG2. According to an embodiment, the first end part EP1 of the light emitting element LD may not overlap the edge of the first alignment electrode AIG1, and the second end part EP2 of the light emitting element LD ay not overlap the edge of the second alignment electrode AIG2.

The second insulating layer INS2 is positioned on an upper surface of the light emitting element LD and is positioned to cover the bank BNK. The second insulating layer INS2 may cover an area of the upper surface of the light emitting element LD and expose the first end part EP1 and the second end part EP2 of the light emitting element LD. The second insulating layer INS2 may stably fix the light emitting element LD. In case that an empty space is present between the first insulation layer INS1 and the light emitting element LD before the second insulation layer INS2 is formed, the empty space may be at least partially filled with the second insulation layer INS2.

The second insulating layer INS2 may include an inorganic insulating layer formed of an inorganic material or an organic insulating layer formed of an organic material. For example, the second insulating layer INS2 may include at least one of metal oxides such as silicon nitride ($SiN_x$), silicon oxide ($SiO_x$), silicon oxynitride ($SiO_xN_y$), and aluminum oxide ($AlO_x$), but the disclosure is not limited thereto. The second insulating layer INS2 may be formed of an inorganic insulating layer advantageous in protecting the light emitting element LD.

The first pixel electrode ET1 is disposed on the second insulating layer INS2, the light emitting element LD, and the first insulating layer INS1.

The first pixel electrode ET1 may contact the first end part EP1 of the light emitting element LD and may be physically and/or electrically connected to the first end part EP1 of the light emitting element LD. The first pixel electrode ET1 may be physically and/or electrically connected to the first alignment electrode AIG1 through the third contact hole CH3. Accordingly, the first driving voltage VDD (FIG. 2) may be applied from the second electrode S1 of the first transistor T1 to the first end part EP1 of the light emitting element LD through the first pixel electrode ET1.

The first pixel electrode ET1 may be configured of various transparent conductive materials in order to cause light emitted from the light emitting element LD and reflected by the first alignment electrode AIG1 to proceed in an image display direction (for example, the third direction DR3) of the display device without loss. For example, the first pixel electrode ET1 may include at least one of various transparent conductive materials (or substances) including indium tin oxide (ITO), indium zinc oxide (IZO), zinc oxide (ZnO), or indium gallium zinc oxide (IGZO), indium tin zinc oxide (ITZO), and the like, and may be configured to be substantially transparent or translucent to satisfy a predetermined light transmittance (or transmittance). However, the material of the first pixel electrode ET1 is not limited to the above-described embodiment. According to an embodiment, the first pixel electrode ET1 may be configured of various opaque conductive materials (or substances). The first pixel electrode ET1 may be formed of a single layer or multiple layers.

The third insulating layer INS3 is positioned on the second insulating layer INS2 and the first pixel electrode ET1 and is positioned to cover at least a part of the second insulating layer INS2 and the first pixel electrode ET1. The third insulating layer INS3 is positioned to cover a part of the second insulating layer INS2 positioned on the light emitting element LD, and is positioned on the second insulating layer INS2 so that the second end part EP2 of the light emitting element LD is exposed.

The third insulating layer INS3 covers (or overlaps) an upper surface and a side surface of the second insulating layer INS2 covering a bank BNK, and is positioned to cover the first pixel electrode ET1 and an area of the second insulating layer INS2.

The third insulating layer INS3 may be positioned only on the upper surface of the second insulating layer INS2 covering another bank BNK, and the third insulating layer INS3 may not be positioned on the side surface of the second insulating layer INS2 covering the other bank BNK.

The third insulating layer INS3 may include an inorganic insulating layer formed of an inorganic material or an organic insulating layer formed of an organic material. For example, the third insulating layer INS3 may include at least one of metal oxides such as silicon nitride ($SiN_x$), silicon oxide ($SiO_x$), silicon oxynitride ($SiO_xN_y$), and aluminum oxide ($AlO_x$), but the disclosure is not limited thereto. According to an embodiment, the third insulating layer INS3 may be provided in the non-display area NDA and may be positioned on the first insulating layer INS1 including the first opening OP1. In this case, the third insulating layer INS3 may include an opening corresponding to the first opening OP1 to expose at least a part of the second pad electrode PE2.

The second pixel electrode ET2 is disposed on the first insulating layer INS1, the second insulating layer INS2, the third insulating layer INS3, the second alignment electrode AIG2, and the light emitting element LD. The second pixel electrode ET2 may be positioned to overlap at least areas of the third insulating layer INS3 and the light emitting element LD.

The second pixel electrode ET2 may contact the second end part EP2 of the light emitting element LD and may be physically and/or electrically connected to the second end part EP2 of the light emitting element LD. The second pixel electrode ET2 may be physically and/or electrically connected to the second alignment electrode AIG2 through the fourth contact hole CH4. Accordingly, the second driving voltage VSS (FIG. 2) may be applied from the driving voltage line DVL to the second end part EP2 of the light emitting element LD through the second pixel electrode ET2.

The second pixel electrode ET2 may be configured of various transparent conductive materials in order to cause light emitted from the light emitting element LD and reflected by the second alignment electrode AIG2 to proceed in the image display direction (for example, the third direction DR3) of the display device without loss. For example, the second pixel electrode ET2 may include at least one of various transparent conductive materials (or substances) including indium tin oxide (ITO), indium zinc oxide (IZO), zinc oxide (ZnO), or indium gallium zinc oxide (IGZO), indium tin zinc oxide (ITZO), and the like, and may be configured to be substantially transparent or translucent to satisfy a predetermined light transmittance (or transmittance). However, the material of the second pixel electrode ET2 is not limited to the above-described embodiment. According to an embodiment, the second pixel electrode ET2 may be configured of various opaque conductive materials (or substances). The second pixel electrode ET2 may be formed of a single layer or multiple layers.

The third pad electrode PE3 is positioned on the second pad electrode PE2 and the first insulating layer INS1. The third pad electrode PE3 may be formed in the non-display area NDA, but the third pad electrode PE3 and the second pixel electrode ET2 formed in the display area DA may be formed by the same process and include the same material. However, the disclosure is not limited thereto, and according to an embodiment, the third pad electrode PE3 and the second pixel electrode ET2 may be formed by different processes and on different layers.

The third pad electrode PE3 may directly contact the second pad electrode PE2 through the first opening OP1 of the first insulating layer INS1. Accordingly, the third pad electrode PE3 may be physically and/or electrically connected to the second pad electrode PE2. The third pad electrode PE3 may be configured as a double layer that is electrically connected to the second pad electrode PE2 to minimize distortion due to a signal delay by reducing a line resistance.

The fourth insulating layer INS4 is disposed over the display area DA and the non-display area NDA. The fourth insulating layer INS4 is positioned to completely cover (or overlap) the third insulating layer INS3 and the second pixel electrode ET2 in the display area DA, and is positioned to completely cover the first insulating layer INS1 and cover at least a part of the third pad electrode PE3 in the non-display area NDA.

The fourth insulating layer INS4 may include a second opening OP2 partially exposing an upper surface of the third pad electrode PE3. An anisotropic conductive film or a flexible printed circuit board, or the like may be attached to the third pad electrode PE3 exposed through the second opening OP2. Accordingly, a data signal, a scan signal, and the like may be applied to the third pad electrode PE3 from an external driving substrate.

The fourth insulating layer INS4 may include an inorganic insulating layer formed of an inorganic material or an organic insulating layer formed of an organic material. For example, the fourth insulating layer INS4 may include at least one of metal oxides such as silicon nitride ($SiN_x$), silicon oxide ($SiO_x$), silicon oxynitride ($SiO_xN_y$), and aluminum oxide ($AlO_x$), but the disclosure is not limited thereto.

The fourth insulating layer INS4 may be an inorganic insulating layer including an inorganic material or an organic insulating layer including an organic material. For example, the insulating layer may have a structure in which at least one inorganic insulating layer or at least one organic insulating layer is alternately stacked. The fourth insulating layer INS4 may entirely cover the display area DA, and may block water, moisture, or the like from flowing into the display area DA including the light emitting elements LD.

According to an embodiment, the display device may be configured to selectively further include an optical layer on the fourth insulating layer INS4. For example, the display device may further include a color conversion layer including color conversion particles that convert light emitted from the light emitting element LD into light of a specific color. The display device further including the optical layer is described below with reference to FIGS. 20 to 22.

According to another embodiment, at least one overcoat layer (for example, a layer for planarizing an upper surface of the display device) may be further disposed on the fourth insulating layer INS4.

Hereinafter, a method of manufacturing the display device of FIG. 4 is described with reference to FIGS. 5 to 18.

FIGS. 5 to 18 are schematic cross-sectional views sequentially illustrating a method of manufacturing a display device according to an embodiment.

First, referring to FIG. 5, in an embodiment, the first conductor SD1 including the first electrode D1 of the first transistor T1 and the first electrode D2 of the second transistor is formed on the substrate SUB of the display device. According to an embodiment, after the buffer layer is formed on the substrate SUB, the first conductor SD1 may be formed on the buffer layer.

The first electrode D1 of the first transistor T1 and the first electrode D2 of the second transistor T2 may be disposed in the display area DA and may be formed to be spaced apart from each other. The first electrode D1 of the first transistor T1 and the first electrode D2 of the second transistor T2 may include the same material and may be formed by a process using the same mask.

Referring to FIGS. 5 and 6, the partition wall WAL including the first partition wall WAL1 and the second partition wall WAL2 is formed on the first conductor SD1.

The first partition wall WAL1 may be formed to at least partially overlap the first electrode D1 of the first transistor T1 and the substrate SUB, and the second partition wall WAL2 may be formed to at least partially overlap the first electrode D2 of the second transistor T2 and the substrate SUB.

The first partition wall WAL1 and the second partition wall WAL2 may be formed to be disposed in the display area DA. The first partition wall WAL1 and the second partition wall WAL2 may be formed of a material formed of an inorganic material.

Referring to FIGS. 5 to 7, the second conductor SD2 including the second electrode S1 of the first transistor T1, the second electrode S2 of the second transistor T2, the first storage electrode CE1, the driving voltage line DVL, and the first pad electrode PE1 is formed on the partition wall WAL and the substrate SUB.

The second electrode S1 of the first transistor T1, the second electrode S2 of the second transistor T2, the first storage electrode CE1, and the driving voltage line DVL may be formed to be disposed in the display area DA, and the first pad electrode PE1 may be formed to be disposed in the non-display area NDA.

Each of the second electrode S1 of the first transistor T1 and the second electrode S2 of the second transistor T2 may be formed to be disposed on an upper surface of the corresponding partition wall WAL.

Each of the first storage electrode CE1 and the driving voltage line DVL may be formed on the substrate SUB to contact a side surface of the first partition wall WAL1 and the second partition wall WAL2. The first storage electrode CE1 and the driving voltage line DVL may be formed to face each other with the first partition wall WAL1 and the second partition wall WAL2 interposed therebetween.

The first pad electrode PE1 may be directly formed on the substrate SUB.

The second electrode S1 of the first transistor T1, the second electrode S2 of the second transistor T2, the first storage electrode CE1, the driving voltage line DVL, and the first pad electrode PE1 may include the same material and may be formed using the same mask. However, the disclosure is not limited thereto, and according to an embodiment, at least one of the second electrode S1 of the first transistor T1, the second electrode S2 of the second transistor T2, the first storage electrode CE1, the driving voltage line DVL, and the first pad electrode PE1 may include different materials and may be formed by different processes using different masks. The first pad electrode PE1 may not be formed.

Referring to FIGS. 5 to 8, the semiconductor layer including the first semiconductor pattern A1 and the second semiconductor pattern A2 is formed on a part of the second conductor SD2.

The first semiconductor pattern A1 may be formed on a side surface of the first partition wall WAL1 between the first electrode D1 and the second electrode S1 of the first transistor T1. The second semiconductor pattern A2 may be formed on a side surface of the second partition wall WAL2 between the first electrode D2 and the second electrode S2 of the second transistor T2. Accordingly, the drain region of the first semiconductor pattern A1 and the second semiconductor pattern A2 may directly contact the first electrodes D1 and D2, and the source region of the first semiconductor pattern A1 and the second semiconductor pattern A2 may directly contact the second electrodes S1 and S2.

Referring to FIGS. 5 to 9, the gate insulating layer GI is formed on the semiconductor layer to cover the first conductor SD1, the semiconductor layer, the second conductor SD2, and the substrate SUB. The gate insulating layer GI may be formed over the display area DA and the non-display area NDA.

Thereafter, the first contact hole CH1 and the second contact hole CH2 may be formed in the gate insulating layer GI so that an upper surface of the second electrode S1 of the first transistor T1 and an upper surface of the driving voltage line DVL are partially exposed. A part of the gate insulating layer GI, corresponding to the first contact hole CH1 and the second contact hole CH2 may be removed by a photolithography process or the like.

Referring to FIGS. 5 to 10, the third conductor SD3 including the first gate electrode G1 of the first transistor T1, the second gate electrode G2 of the second transistor T2, the first alignment electrode AIG1 (or the second storage electrode CE2), the second alignment electrode AIG2, and the second pad electrode PE2 is formed on the gate insulating layer GI.

The first gate electrode G1 of the first transistor T1, the second gate electrode G2 of the second transistor T2, the first alignment electrode AIG1 (or the second storage electrode CE2), and the second alignment electrode AIG2 may be formed to be disposed in the display area DA, and the second pad electrode PE2 may be formed to be disposed in the non-display area NDA.

In an embodiment, the first gate electrode G1 of the first transistor T1, the second gate electrode G2 of the second transistor T2, the first alignment electrode AIG1, and the second alignment electrode AIG2 may be formed by the same process using the same mask. Accordingly, a process time and cost may be reduced compared to a case where the first gate electrode G1 of the first transistor T1, the second gate electrode G2 of the second transistor T2, the first alignment electrode AIG1, and the second alignment electrode AIG2 are formed by separate processes using separate masks.

The disclosure is not limited thereto, and according to an embodiment, at least one of the first gate electrode G1 of the first transistor T1, the second gate electrode G2 of the second transistor T2, and the first alignment electrode AIG1 (or the second storage electrode CE2), the second alignment electrode AIG2, and the second pad electrode PE2 may include different materials and may be formed by different processes using different masks.

Referring to FIGS. 5 to 11, the first insulating layer INS1 is formed on the third conductor SD3 to cover (or overlap) the gate insulating layer GI and the third conductor SD3. The first insulating layer INS1 may be formed entirely over the display area DA and the non-display area NDA.

Thereafter, the third contact hole CH3 and the fourth contact hole CH4 may be formed in the first insulating layer INS1 so that an upper surface of the first alignment electrode AIG1 and an upper surface of the second alignment electrode AIG2 are partially exposed. The first opening OP1 may be formed so that an upper surface of the second pad electrode PE2 is partially exposed. A part of the first insulating layer INS1, corresponding to the third contact hole CH3, the fourth contact hole CH4, and the first opening OP1 may be removed by a photolithography process or the like.

Referring to FIGS. 5 to 12, the bank BNK is formed on the first insulating layer INS1. The bank BNK may be formed to be disposed in the display area DA. Two banks BNK may be formed with an area in which the light emitting element LD may be disposed between the two banks BNK, in order to distinguish each pixel area.

Referring to FIGS. 5 to 13, the light emitting element LD is formed on the first insulating layer INS1.

At least one light emitting element LD may be formed, and light emitting elements LD may be included in a solution sprayed from the inkjet printing device. The inkjet printing device may spray the solution including the light emitting elements LD between the two banks BNK. The solution may include a solvent and a solid content, and for example, the solvent may be formed of acetone, water, alcohol, propylene glycol methyl ether acetate (PGMEA), toluene, or the like, and may be a material that is vaporized or volatilized at room temperature or by heat. Accordingly, the light emitting elements LD included in the solid content may be disposed on the first insulating layer INS1.

The light emitting element LD may be formed on the first insulating layer INS1 corresponding to the other side surfaces of the first partition wall WAL1 and the second partition wall WAL2. Accordingly, in the formation process by the inkjet printing device, the first semiconductor pattern A1 and the second semiconductor pattern A2 may not be affected.

After the solution is sprayed, in case that a predetermined alignment voltage (or alignment signal) is applied to the first alignment electrode AIG1 and the second alignment electrode AIG2, the light emitting element LD is aligned on the first insulating layer INS1 corresponding to a region between the first alignment electrode AIG1 and the second alignment electrode AIG2 while an electric field is formed between the first alignment electrode AIG1 and the second alignment electrode AIG2.

After the light emitting elements LD are aligned, the solution may be volatilized or removed by other methods to stably arrange the light emitting elements LD between the first alignment electrode AIG1 and the second alignment electrode AIG2. The first end part EP1 of the light emitting element LD may be arranged to face the edge of the first alignment electrode AIG1, and the second end part EP2 of the light emitting element LD may be arranged to face the edge of the second alignment electrode AIG2.

Referring to FIGS. 5 to 14, the second insulating layer INS2 is formed on the light emitting element LD and the bank BNK. The second insulating layer INS2 may be formed to be disposed in the display area DA.

The second insulating layer INS2 may be formed on the upper surface of the light emitting element LD so that the first end part EP1 and the second end part EP2 of the light emitting element LD are exposed, thereby stably fixing the light emitting element LD. The second insulating layer INS2 may be formed on the two banks BNK to cover (or overlap) an upper surface and a side surface of the two banks BNK.

The second insulating layer INS2 may be formed using a halftone mask, and a thickness of the second insulating layer INS2 covering a part of the light emitting element LD and a thickness of the second insulating layer INS2 covering the bank BNK may be different.

Referring to FIGS. 5 to 15, the first pixel electrode ET1 is formed on the second insulating layer INS2, the light emitting element LD, and the first insulating layer INS1. The first pixel electrode ET1 may be formed to be disposed in the display area DA.

The first pixel electrode ET1 may be formed to contact the side surface of the second insulating layer INS2 and the first end part EP1 of the light emitting element LD, and may be formed to be electrically connected to the first alignment electrode AIG1 through the third contact hole CH3 of the first insulating layer INS1.

Referring to FIGS. 5 to 16, the third insulating layer INS3 is formed on the second insulating layer INS2 and the first pixel electrode ET1. The third insulating layer INS3 may be formed to be disposed in the display area DA.

The third insulating layer INS3 may cover (or overlap) the upper surface and a side surface of the second insulating layer INS2 covering a bank BNK, and may be formed to cover a part of the second insulating layer INS2 and the first pixel electrode ET1. In this case, the third insulating layer INS3 may cover an area of the second insulating layer INS2 so that the second end part EP2 of the light emitting element LD is exposed.

The third insulating layer INS3 may be formed only on the upper surface of the second insulating layer INS2 covering the other bank BNK. In this case, the third insulating layer INS3 may not be formed on the side surface of the second insulating layer INS2 covering the other bank BNK.

Referring to FIGS. 5 to 17, the second pixel electrode ET2 and the third pad electrode PE3 are formed on a part of the first insulating layer INS1, the second insulating layer INS2, the third insulating layer INS3, the light emitting element LD, and the third conductor SD3.

In the display area DA, the second pixel electrode ET2 may be formed to contact a side surface of the third insulating layer INS3, the second end part EP2 of the light emitting element LD, the side surface of the second insulating layer INS2, and an upper surface of the insulating layer INS1. In the display area DA, the second pixel electrode ET2 may be formed to contact the second alignment electrode AIG2 through the fourth contact hole CH4 formed in the first insulating layer INS1.

In the non-display area NDA, the third pad electrode PE3 may be formed to contact the second pad electrode PE2 through the first opening OP1 of the first insulating layer INS1.

Since the second pixel electrode ET2 and the third pad electrode PE3 may be formed by a same process and include the same material, a process time and cost may be reduced compared to a case where the second pixel electrode ET2 and the third pad electrode PE3 are formed using separate masks.

The disclosure is not limited thereto. According to an embodiment, the third pad electrode PE3 and the second pixel electrode ET2 may be formed by different processes and may be provided on different layers.

Referring to FIGS. 5 to 18, a fourth insulating layer INS4 is formed over the display area DA and the non-display area NDA.

In the display area DA, the fourth insulating layer INS4 may be formed to completely cover the third insulating layer INS3 and the second pixel electrode ET2.

In the non-display area NDA, the fourth insulating layer INS4 may be formed to completely cover the first insulating layer INS1 and expose at least a part of the third pad electrode PE3.

An anisotropic conductive film a flexible printed circuit board, or the like may be attached to the second opening OP2 of the fourth insulating layer INS4 through which the third pad electrode PE3 is exposed.

Hereinafter, a schematic cross-sectional view of a display device according to an embodiment is described with reference to FIG. 19.

Figure 19:
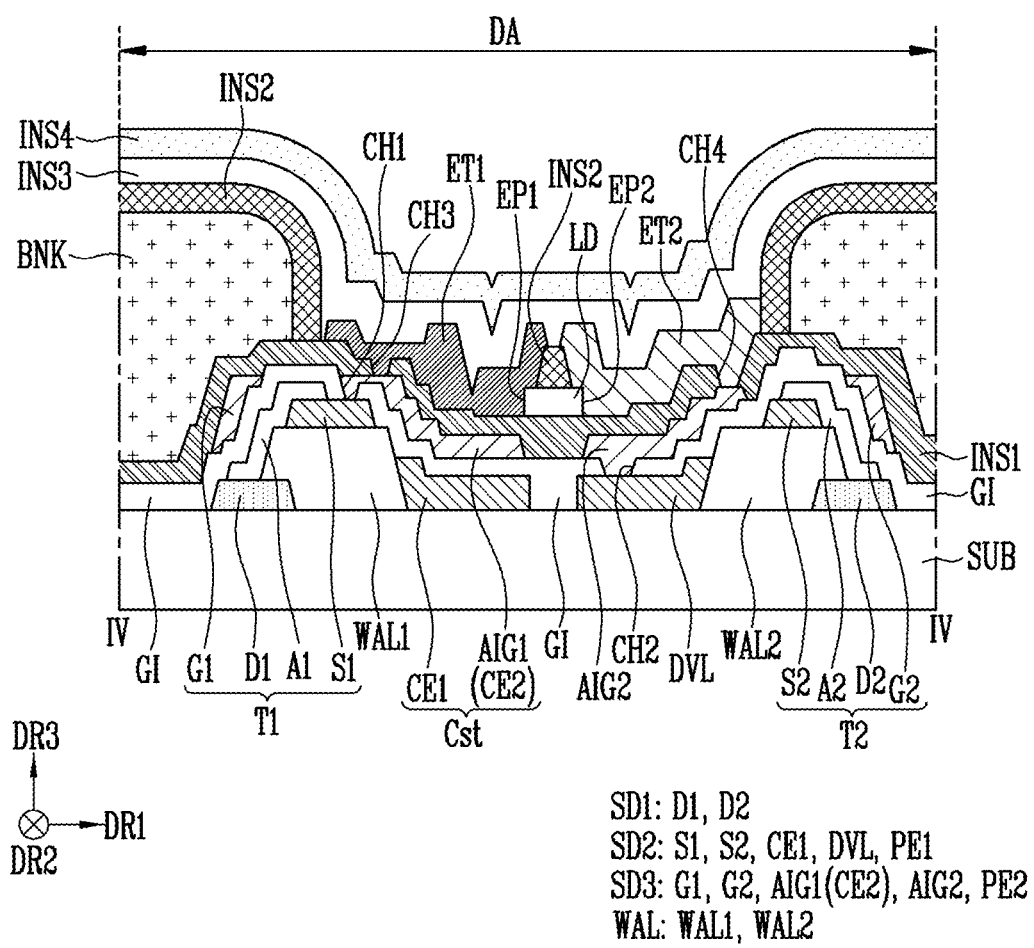
FIG. 19 is a cross-sectional view schematically illustrating a display device according to an embodiment.

FIG. 19 is a cross-sectional view schematically illustrating a display device according to an embodiment. The display device shown in FIG. 19 illustrates a part of the pixel PXL positioned in the display area DA of FIG. 1.

Referring to FIG. 19, the display device may include the substrate SUB, the first conductor SD1, the partition wall WAL, the second conductor SD2, the semiconductor layer, the third conductor SD3, the bank BNK, the light emitting element LD, the first pixel electrode ET1, the second pixel electrode ET2, and the insulating layers GI, INS1, INS2, INS3, and INS4.

The display device shown in FIG. 19 is similar to the pixel PXL positioned in the display area DA of FIG. 4. Hereinafter, a description repetitive of that of FIG. 4 is omitted and differences are mainly described.

The first pixel electrode ET1 is disposed on the second insulating layer INS2, the light emitting element LD, and the first insulating layer INS1. The second pixel electrode ET2 is disposed on the second insulating layer INS2, the light emitting element LD, and the first insulating layer INS1. The first pixel electrode ET1 and the second pixel electrode ET2 are spaced apart from each other in the first direction DR1. Specifically, one end part (or first end part) of the first pixel electrode ET1 and one end part of the second pixel electrode ET2 may be positioned on the second insulating layer INS2, and one end part of the first pixel electrode ET1 and one end part of the second pixel electrode ET2 may be spaced apart from each other on the second insulating layer INS2.

The third insulating layer INS3 is disposed on the second insulating layer INS2, the first pixel electrode ET1, and the second pixel electrode ET2, and is positioned to cover (or overlap) the second insulating layer INS2, the first pixel electrode ET1, and the second pixel electrode ET2. According to a length and/or a position of the first pixel electrode ET1 and/or the second pixel electrode ET2, the third insulating layer INS3 may be positioned to cover a partial region of the first insulating layer INS1.

The third insulating layer INS3 covers the upper surface and the side surface of the second insulating layer INS2 covering a bank BNK, extends to cover an upper surface of the first pixel electrode ET1, and cover a part of the upper surface of the second insulating layer INS2 positioned on the light emitting element LD. The third insulating layer INS3 covers the upper surface and the side surface of the second insulating layer INS2 covering the other bank BNK, and extends to cover an upper surface of the second pixel electrode ET2.

The fourth insulating layer INS4 is positioned on the third insulating layer INS3 and is positioned to completely cover an upper surface of the third insulating layer INS3.

The fourth insulating layer INS4 may include an inorganic insulating layer formed of an inorganic material or an organic insulating layer formed of an organic material. For example, the insulating layer may have a structure in which at least one inorganic insulating layer or at least one organic insulating layer is alternately stacked. The fourth insulating layer INS4 may entirely cover the display area DA, and may block water, moisture, or the like from flowing into the display area DA including the light emitting elements LD.

According to an embodiment, the display device may be configured to selectively further include an optical layer on the fourth insulating layer INS4. For example, the display device may further include a color conversion layer including color conversion particles that convert light emitted from the light emitting element LD into light of a specific color. The display device further including the optical layer is described below with reference to FIGS. 20 to 22.

Figure 20:
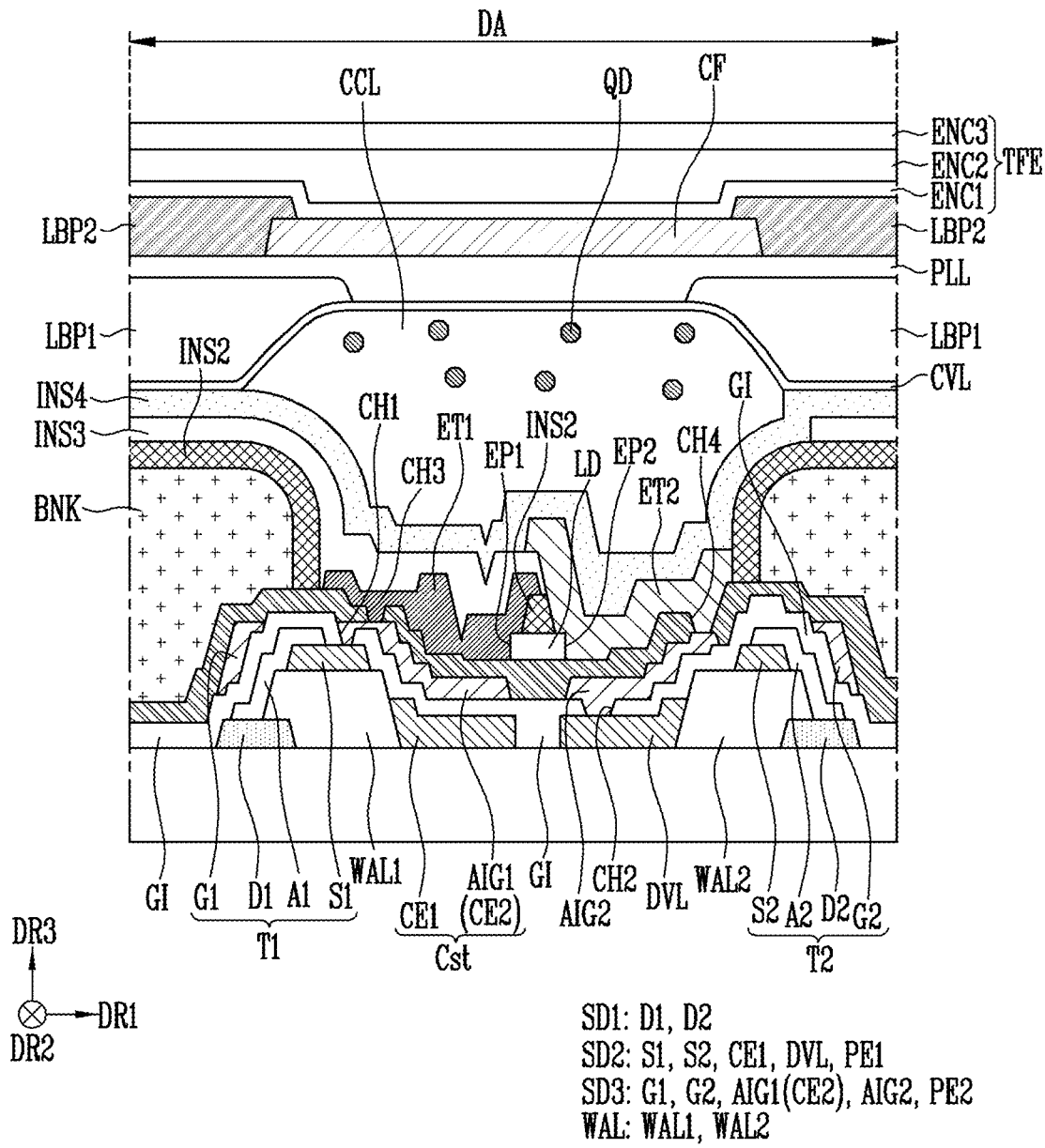
FIG. 20 is a cross-sectional view schematically illustrating a display device according to an embodiment.
Figure 21:
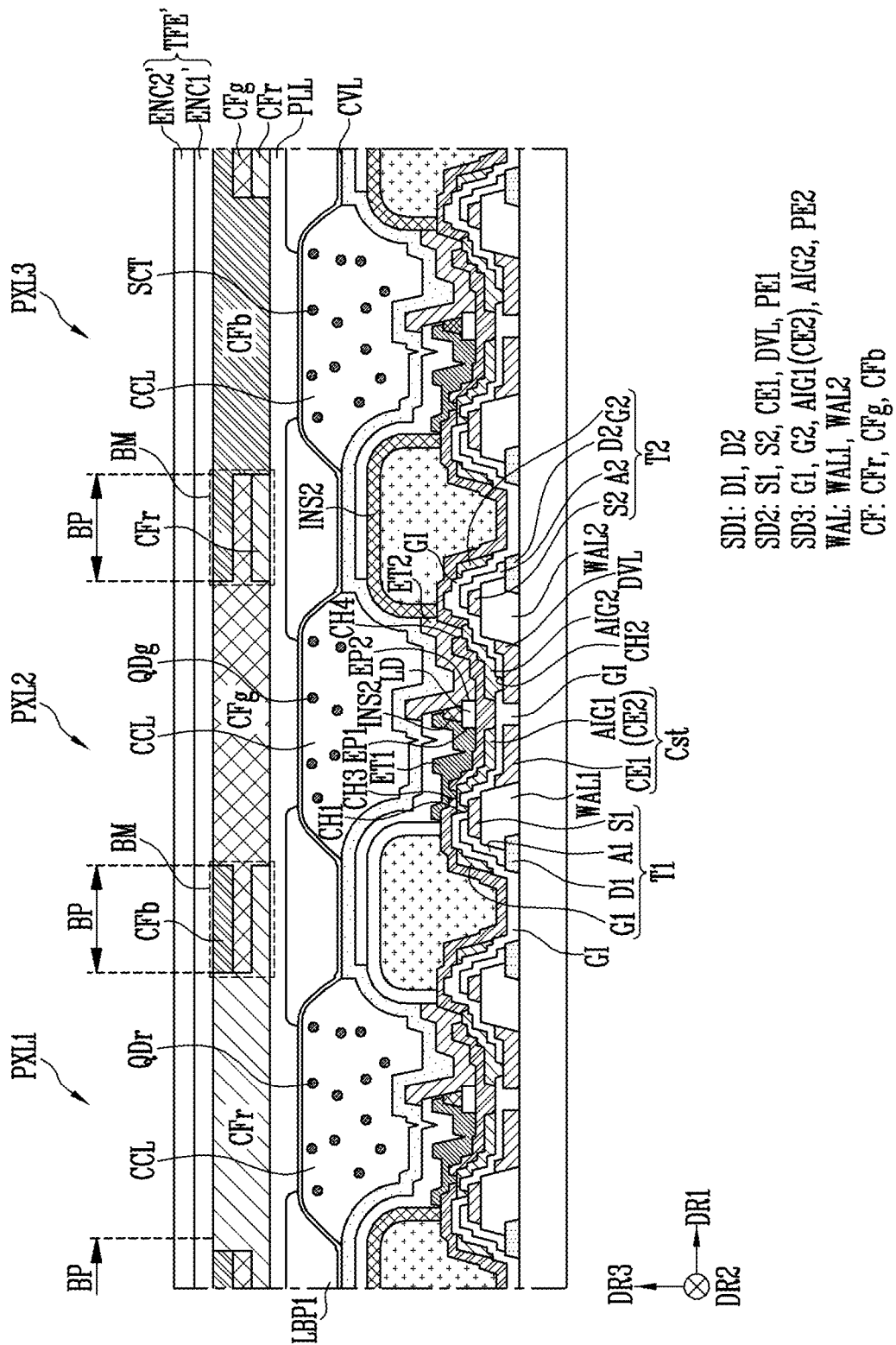
FIGS. 21 to 23 are cross-sectional views schematically illustrating a display device according to an embodiment.
Figure 22:
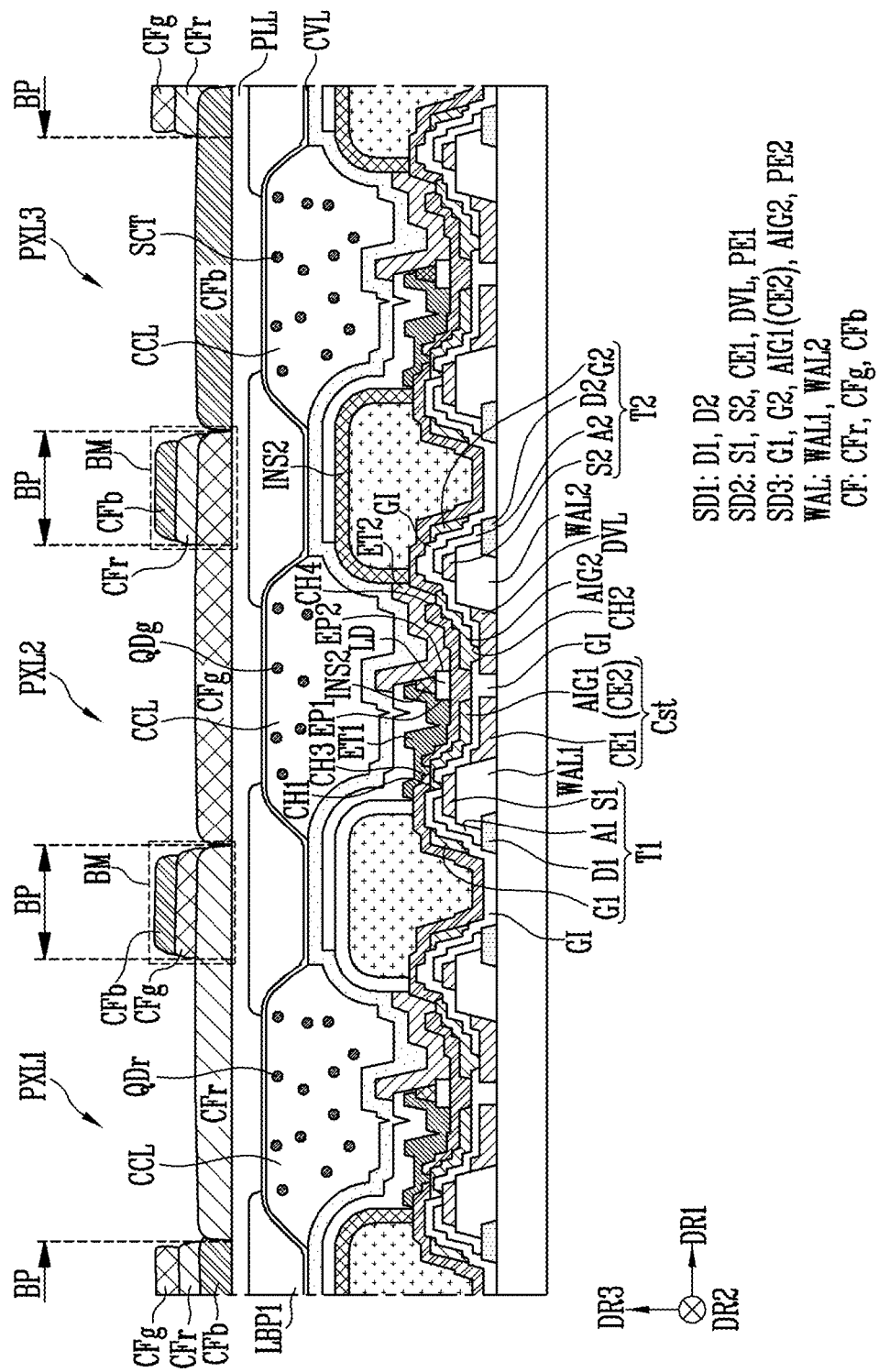
Figure 23:
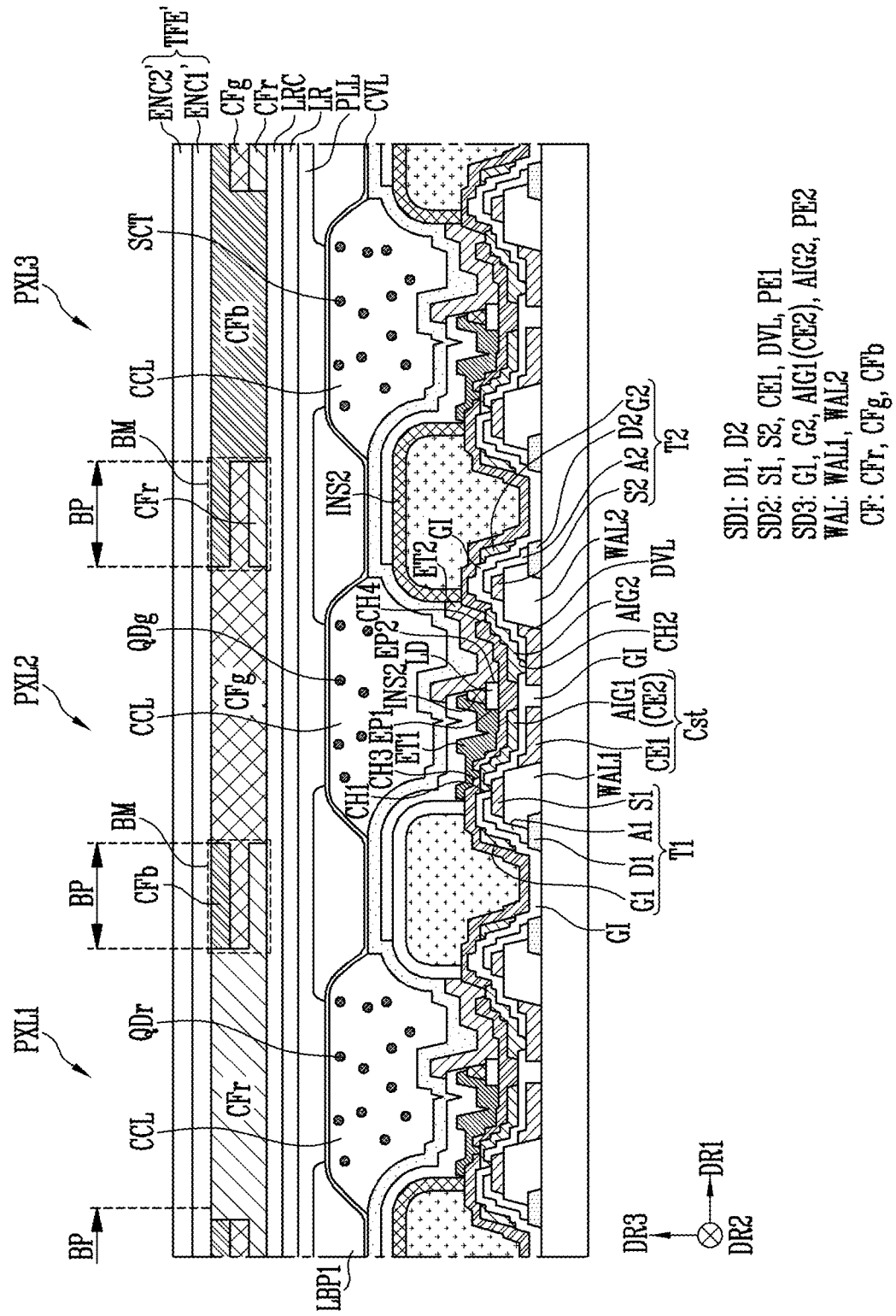

FIG. 20 is a cross-sectional view schematically illustrating a display device according to an embodiment, and FIGS. 21 to 23 are cross-sectional views schematically illustrating a display device according to an embodiment.

First, referring to FIG. 20, the display device according to an embodiment may further include a color conversion layer CCL, a thin film encapsulation layer TFE, and the like in a structure of the pixel PXL positioned in the display area DA of FIG. 4. Hereinafter, a description repetitive of that of FIG. 4 is omitted, and differences are mainly described.

The color conversion layer CCL is positioned on the fourth insulating layer INS4 corresponding to an upper part of the light emitting element LD. The color conversion layer CCL includes color conversion particles (for example, a quantum dot QD of a predetermined color) for converting light of a first color emitted from the light emitting element LD into light of a second color.

For example, in case that at least one pixel PXL is set as a red (or green) pixel PXL and a blue light emitting element LD is disposed as a light source of the pixel PXL, a color conversion layer CCL including a red (or green) quantum dot QD for converting blue light into red (or green) light may be disposed on an upper part of the pixel PXL. A red (or green) color filter CF may be disposed on the color conversion layer CCL.

A cover layer CVL for protecting the color conversion layer CCL is positioned on the color conversion layer CCL and the fourth insulating layer INS4. A first light blocking pattern LBP1 is disposed on the cover layer CVL corresponding to an outer side of the color conversion layer CCL. FIG. 19 illustrates an embodiment in which the first light blocking pattern LBP1 is formed after the color conversion layer CCL is first formed, but the disclosure is not limited thereto. For example, a formation order of the color conversion layer CCL and the first light blocking pattern LBP1 may be changed according to a process method, performance of equipment, and the like applied to formation of the color conversion layer CCL.

A planarization layer PLL may be positioned on the cover layer CVL and the first light blocking pattern LBP1. The planarization layer PLL may planarize an upper surface of the color conversion layer CCL and the first light blocking pattern LBP1 and may include an organic material or an inorganic material.

The color filter CF is disposed in the emission area where light is emitted from each pixel PXL. The color filter CF includes a color filter material capable of selectively transmitting light of a color corresponding to a color of each pixel PXL. A second light blocking pattern LBP2 may be disposed outside the color filter CF.

The thin-film encapsulation layer TFE is positioned on the color filter CF and the second light blocking pattern LBP2.

The thin-film encapsulation layer TFE may be formed of a single-layer or multi-layered film. In an embodiment, the thin-film encapsulation layer TFE may include insulating layers covering the color filter CF and the second light blocking pattern LBP2. For example, the thin-film encapsulation layer TFE may include at least one inorganic layer and at least one organic layer. For example, the thin-film encapsulation layer TFE may have a structure in which an inorganic layer and an organic layer are alternately stacked.

In an embodiment, the thin-film encapsulation layer TFE includes a first encapsulation layer ENC1, a second encapsulation layer ENC2, and a third encapsulation layer ENC3.

The first encapsulation layer ENC1 may be positioned over at least a part of the display area DA (FIG. 4) and the non-display area NDA (FIG. 4). The second encapsulation layer ENC2 may be disposed on the first encapsulation layer ENC1 and may be positioned over at least a part of the display area DA and the non-display area NDA. The third encapsulation layer ENC3 may be disposed on the second encapsulation layer ENC2 and may be positioned over at least a part of the display area DA and the non-display area NDA. In an embodiment, the first encapsulation layer ENC1, the second encapsulation layer ENC2, and the third encapsulation layer ENC3 may be formed of an inorganic layer including an inorganic material, and the second encapsulation layer ENC2 may be formed of an organic layer including an organic material.

Referring to FIGS. 21 and 22, the display device according to an embodiment may further include the color conversion layer CCL, the thin film encapsulation layer TFE, and the like in the structure of the pixel PXL positioned in the display area DA of FIG. 4. Hereinafter, a description repetitive of that of FIG. 4 is omitted, and differences are mainly described.

In an embodiment, three pixels PXL emitting different colors and arranged adjacent to each other in the first direction DR1 are shown. The pixel PXL disposed in a center based on the first direction DR1 may be set as a second pixel PXL2 emitting green light, the pixel PXL disposed on a left side may be set as a first pixel PXL1 emitting red light, and the pixel PXL disposed on a right side may be set as a third pixel PXL3 emitting blue light. However, the disclosure is not limited thereto, and the light emitted from each pixel PXL may be variously changed.

The color conversion layer CCL is positioned on the fourth insulating layer INS4 corresponding to the upper part of the light emitting element LD. The color conversion layer CCL includes color conversion particles (for example, a quantum dot QD of a predetermined color) for converting light of a first color emitted from the light emitting element LD into light of a second color.

For example, a red quantum dot QDr is disposed in an upper part of the first pixel PXL1 emitting the red light, and a green quantum dot QDg is disposed in an upper part of the second pixel PXL2 emitting the green light. Light scattering particles SCT for transmitting light emitted from the light emitting element LD as it is are disposed in an upper part of the third pixel PXL3 emitting the blue light. The light scattering particles SCT may be titanium oxide ($Ti_xO_y$) including titanium dioxide ($TiO_2$), silica, or the like, but is not limited thereto. According to an embodiment, the light scattering particles SCT may be disposed in the upper part of the first pixel PXL1 and may also be disposed in the upper part of the second pixel PXL2. For example, the red quantum dot QDr and the light scattering particles SCT may be disposed in the upper part of the first pixel PXL1 emitting the red light, and the green quantum dot QDg and the light scattering particles SCT may be disposed in the upper part of the second pixel PXL2 emitting the green light.

The cover layer CVL for protecting the color conversion layer CCL is positioned on the color conversion layer CCL and the fourth insulating layer INS4. The first light blocking pattern LBP1 is disposed on the cover layer CVL corresponding to an outer side of the color conversion layer CCL. The first blocking pattern LBP1 may be disposed between two adjacent pixels PXL. For example, a first blocking pattern LBP1 may be disposed between the first pixel PXL1 and the second pixel PXL2, and another first blocking pattern LBP1 may be disposed between the second pixel PXL2 and the third pixel PXL3.

The planarization layer PLL may be positioned on the cover layer CVL and the first light blocking pattern LBP1. The planarization layer PLL may planarize an upper surface of the color conversion layer CCL and the first light blocking pattern LBP1 and may include an organic material or an inorganic material.

The color filter CF is disposed in the emission area where light is emitted from each pixel PXL. The color filter CF includes a color filter material capable of selectively transmitting light of a color corresponding to the color of each pixel PXL.

In an embodiment, a red color filter CFr may be disposed in the upper part of the first pixel PXL1 emitting the red light, a green color filter CFg may be disposed in the upper part of the second pixel PXL2 emitting the green light, and a blue color filter CFb may be disposed in the upper part of the third pixel PXL3 emitting the blue light.

A black matrix BM is disposed between the color filters CF disposed in each pixel PXL. The black matrix BM includes stacked color filters CF. The black matrix BM includes a part of the red color filter CFr, a part of the green color filter CFg, and a part of the blue color filter CFb stacked in a light blocking pattern area BP.

For example, referring to FIG. 21, in the light blocking pattern area BP between the first pixel PXL1 and the second pixel PXL2, the red color filter CFr, the green color filter CFg, and the blue color filter CFb are disposed and the color filter CF functions as the black matrix BM. The red color filter CFr positioned in the light blocking pattern area BP between the first pixel PXL1 and the second pixel PXL2 may be a part of the red color filter CFr extended from the first pixel PXL1, and the green color filter CFg may be a part of the green color filter CFg extended from the second pixel PXL2. Accordingly, in the light blocking pattern area BP between the first pixel PXL1 and the second pixel PXL2, the red color filter CFr, the green color filter CFg, and the blue color filter CFb may be sequentially stacked in the third direction DR3.

The red color filter CFr, the green color filter CFg, and the blue color filter CFb are disposed in the light blocking pattern area BP between the second pixel PXL2 and the third pixel PXL3, and the color filter functions as the black matrix BM. The green color filter CFg positioned in the light blocking pattern area BP between the second pixel PXL2 and the third pixel PXL3 may be a part of the green color filter CFg extended from the second pixel PXL2, and the blue color filter CFb may be a part of the blue color filter CFb extended from the third pixel PXL3. Accordingly, in the light blocking pattern area BP between the second pixel PXL2 and the third pixel PXL3, the red color filter CFr, the green color filter CFg, and the blue color filter CFb may be sequentially stacked in the third direction DR3.

For example, referring to FIG. 22, in the light blocking pattern area BP between the first pixel PXL1 and the second pixel PXL2, the red color filter CFr, the green color filter CFg, and the blue color filter CFb are disposed and the color filter CF functions as the black matrix BM. The red color filter CFr positioned in the light blocking pattern area BP between the first pixel PXL1 and the second pixel PXL2 may be a part of the red color filter CFr extended from the first pixel PXL1, and the green color filter CFg may be a part of the green color filter CFg positioned in the second pixel PXL2. The blue color filter CFb may be a part of the blue color filter CFb positioned in the third pixel PXL3.

The red color filter CFr, the green color filter CFg, and the blue color filter CFb are disposed in the light blocking pattern area BP between the second pixel PXL2 and the third pixel PXL3, and the color filter functions as the black matrix BM. The green color filter CFg positioned in the light blocking pattern area BP between the second pixel PXL2 and the third pixel PXL3 may be a part of the green color filter CFg extended from the second pixel PXL2, and the blue color filter CFb may be a part of the blue color filter CFb positioned in the third pixel PXL3. The red color filter CFr may be a part of the red color filter CFr positioned in the first pixel PXL1.

A thin-film encapsulation layer TFE' may be positioned on the color filter CF. The thin-film encapsulation layer TFE' may be formed of a single-layer or multi-layered film.

In an embodiment, the thin-film encapsulation layer TFE' may include two insulating layers covering the color filter CF. At least one layer may include an inorganic layer, and at least one layer may include an organic layer. Both the layers may include an inorganic layer.

The thin-film encapsulation layer TFE' includes a first encapsulation layer ENC1' and a second encapsulation layer ENC2'. In an embodiment, at least one layer of the first encapsulation layer ENC1' and the second encapsulation layer ENC2' may be an inorganic layer, and the other layer may be an organic layer. Both of the first encapsulation layer ENC1' and the second encapsulation layer ENC2' may be inorganic layers.

Referring to FIG. 23, a display device according to an embodiment may further include a low-refractive organic layer LR and a low-refractive capping layer LRC in a structure of FIG. 21. Hereinafter, a description repetitive of that of FIG. 21 is omitted, and differences are mainly described.

The low-refractive organic layer LR is disposed on the planarization layer PLL. The low-refractive organic layer LR may be positioned to completely cover the planarization layer PLL.

The low-refractive organic layer LR may include an organic material. For example, the low-refractive organic layer LR may be formed as a single layer including an organic material such as an acrylic resin, an epoxy resin, a phenolic resin, a polyamide resin, or a polyimide resin, but the disclosure is not limited thereto.

The low-refractive capping layer LRC may be positioned on the low-refractive organic layer LR and may be positioned to completely cover the low-refractive organic layer LR. For example, the low-refractive capping layer LRC may be positioned between the low-refractive organic layer LR and the color filter CF.

The low-refractive capping layer LRC may include an organic material. For example, the low-refractive capping layer LRC may be formed as a single layer including an organic material such as acrylic resin, epoxy resin, phenolic resin, polyamide resin, and polyimide resin, but may be formed of an organic material having a refractive index higher than that of the low-refractive organic layer LR. The disclosure is not limited thereto.

In an embodiment, as the low-refractive organic layer LR and the low-refractive capping layer LRC are included, light efficiency of the pixel PXL may be secured.

Although the disclosure has been described with reference to the embodiment above, those skilled in the art or those having a common knowledge in the art will understand that the disclosure may be various modified and changed without departing from the spirit and technical area of the disclosure.

Therefore, the technical scope of the claimed invention should not be limited to the contents described in the detailed description of the specification, but should be defined by the claims.

What is claimed is:

1. A display device comprising:
   a substrate;
   a first bank pattern and a second bank pattern disposed on the substrate and spaced apart from each other;
   a gate-insulating layer overlapping the first bank pattern;
   a first transistor including:
      a first electrode and a second electrode disposed on the substrate with the first bank pattern interposed therebetween in a thickness direction of the substrate, the second electrode being disposed on a top surface of the first bank pattern;
      a first semiconductor pattern electrically connected to the first electrode and the second electrode and disposed on a side surface of the first bank pattern; and
      a first gate electrode disposed to correspond to the first semiconductor pattern with the gate-insulating layer interposed therebetween;
   a light-emitting element electrically connected to the first transistor and having a first end part and a second end part;
   a first pixel electrode that directly electrically contacts the first end part of the light-emitting element; and
   a second pixel electrode that directly electrically contacts the second end part of the light-emitting element,
   wherein the first pixel electrode is an anode of the light-emitting element and is connected to a first driving power,
   wherein the second pixel electrode is a cathode of the light-emitting element and is connected to a second driving power, and
   wherein the first driving power and the second driving power have different respective potentials.

2. The display device according to claim 1, wherein the first bank pattern and the second bank pattern include an inorganic material.

3. The display device according to claim 1, further comprising a second transistor electrically connected to the first transistor, the second transistor comprising:
   another first electrode and another second electrode disposed on the substrate with the second bank pattern interposed therebetween in the thickness direction of the substrate;
   a second semiconductor pattern electrically connected to the other first electrode and the other second electrode and disposed on a side surface of the second bank pattern; and
   a second gate electrode disposed to correspond to the second semiconductor pattern with the gate-insulating layer interposed therebetween.

4. The display device according to claim 1, wherein the light-emitting element has a rod-shape, and comprises an active layer disposed between a first semiconductor layer and a second semiconductor layer,
- wherein the first semiconductor layer corresponds to the first end part, and
- wherein the second semiconductor layer corresponds to the second end part.

5. The display device according to claim 4, wherein the light-emitting element is disposed between another side surface of the first bank pattern and another side surface of the second bank pattern.

6. The display device according to claim 5, further comprising a storage capacitor comprising:
- a first storage electrode disposed along the another side surface of the first bank pattern and an upper surface of the substrate; and
- a second storage electrode overlapping the first storage electrode,
- wherein the first bank pattern is disposed between the substrate and the first storage electrode in the thickness direction of the substrate.

7. The display device according to claim 6, wherein the gate-insulating layer is disposed between the first storage electrode and the second storage electrode, and
- wherein the first bank pattern is disposed between the gate-insulating layer and the substrate in the thickness direction of the substrate.

8. The display device according to claim 6, wherein the first storage electrode is electrically connected to the first gate electrode.

9. The display device according to claim 6, wherein the second storage electrode is a first alignment electrode for aligning the light-emitting element.

10. The display device according to claim 9, further comprising:
- a driving voltage line disposed along the another side surface of the second bank pattern and the upper surface of the substrate; and
- a second alignment electrode disposed on the driving voltage line,
- wherein the display device is configured to align the light-emitting element between the first alignment electrode and the second alignment electrode by applying different respective voltages to the first alignment electrode and the second alignment electrode after being deposited by an ink jet technique.

11. The display device according to claim 10, further comprising a first insulating layer overlapping the first alignment electrode and the second alignment electrode.

12. The display device according to claim 11, wherein the second electrode of the first transistor is electrically connected to the first alignment electrode through a first contact hole of the gate-insulating layer, and
- wherein the first alignment electrode is electrically connected to the first pixel electrode through a second contact hole of the first insulating layer.

13. The display device according to claim 11, wherein the driving voltage line is electrically connected to the second alignment electrode through a third contact hole of the gate-insulating layer, and
- wherein the second alignment electrode is electrically connected to the second pixel electrode through a fourth contact hole of the first insulating layer.

14. The display device according to claim 1, wherein the light-emitting element has a size of a nanoscale to a microscale.

* * * * *